(12) United States Patent
Saito et al.

(10) Patent No.: US 11,169,441 B2
(45) Date of Patent: Nov. 9, 2021

(54) COMPOSITION FOR FORMING RESIST UNDERLAYER FILM, RESIST UNDERLAYER FILM, METHOD FOR FORMING RESIST PATTERN AND METHOD FOR PRODUCING SEMICONDUCTOR DEVICE

(71) Applicant: NISSAN CHEMICAL CORPORATION, Tokyo (JP)

(72) Inventors: Daigo Saito, Toyama (JP); Keisuke Hashimoto, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 12 days.

(21) Appl. No.: 16/631,011

(22) PCT Filed: Jul. 12, 2018

(86) PCT No.: PCT/JP2018/026361
§ 371 (c)(1),
(2) Date: Jan. 14, 2020

(87) PCT Pub. No.: WO2019/013293
PCT Pub. Date: Jan. 17, 2019

(65) Prior Publication Data
US 2020/0142310 A1    May 7, 2020

(30) Foreign Application Priority Data
Jul. 14, 2017 (JP) .............................. JP2017-138499

(51) Int. Cl.
| | |
|---|---|
| G03F 7/11 | (2006.01) |
| C08G 8/20 | (2006.01) |
| C09D 161/12 | (2006.01) |
| H01L 21/027 | (2006.01) |
| H01L 21/311 | (2006.01) |
| H01L 21/308 | (2006.01) |
| G03F 7/16 | (2006.01) |
| G03F 7/20 | (2006.01) |

(52) U.S. Cl.
CPC ................ G03F 7/11 (2013.01); C08G 8/20 (2013.01); C09D 161/12 (2013.01); H01L 21/0274 (2013.01); H01L 21/0277 (2013.01); H01L 21/3081 (2013.01); H01L 21/3086 (2013.01); H01L 21/31133 (2013.01); G03F 7/162 (2013.01); G03F 7/168 (2013.01); G03F 7/2002 (2013.01); G03F 7/2037 (2013.01)

(58) Field of Classification Search
CPC . G03F 7/11; G03F 7/162; G03F 7/168; G03F 7/2002; G03F 7/2037; G03F 7/094; C08G 8/20; C09D 161/12; H01L 21/0274; H01L 21/0277; H01L 21/3081; H01L 21/3086; H01L 21/31133; H01L 21/0332

USPC ......... 430/272.1, 271.1, 270.1, 311; 438/703
See application file for complete search history.

(56) References Cited

U.S. PATENT DOCUMENTS

| | | | |
|---|---|---|---|
| 2006/0269867 A1 | 11/2006 | Uh et al. | |
| 2016/0139509 A1* | 5/2016 | Hashimoto | .......... C09D 161/22 438/703 |
| 2017/0315445 A1* | 11/2017 | Hashimoto | ....... H01L 21/30604 |

FOREIGN PATENT DOCUMENTS

| | | |
|---|---|---|
| JP | 2008-546009 A | 12/2008 |
| JP | 2012-214720 A | 11/2012 |
| JP | 2016-206676 A | 12/2016 |
| WO | 2014/208542 A1 | 12/2014 |
| WO | 2016/072316 A1 | 5/2016 |
| WO | 2016/143635 A1 | 9/2016 |
| WO | 2016/147989 A1 | 9/2016 |
| WO | 2016/158457 A1 | 10/2016 |
| WO | 2017/069063 A1 | 4/2017 |

OTHER PUBLICATIONS

Sep. 25, 2018 Search Report issued in International Patent Application No. PCT/JP2018/026361.

*Primary Examiner* — Caleen O Sullivan
(74) *Attorney, Agent, or Firm* — Oliff PLC

(57) ABSTRACT

A resist underlayer film forming composition characterized by containing (A) a compound represented by formula (1) (in formula (1), independently, $R^1$ represents a C1 to C30 divalent group; each of $R^2$ to $R^7$ represents a C1 to C10 linear, branched, or cyclic alkyl group, a C6 to C10 aryl group, a C2 to C10 alkenyl group, a thiol group, or a hydroxyl group; at least one $R^5$ is a hydroxyl group or a thiol group; each of $m^2$, $m^3$, and $m^6$ is an integer of 0 to 9; each of $m^4$ and $m^7$ is an integer of 0 to 8; $m^5$ is an integer of 1 to 9; n is an integer of 0 to 4; and each of $p^2$ to $p^7$ is an integer of 0 to 2) and a cross-linkable compound represented by formula (2-1) or (2-2) (in formula (2), $Q^1$ represents a single bond or an $m^{12}$-valent organic group; each of $R^{12}$ and $R^{15}$ independently represents a C2 to C10 alkyl group or a C2 to C10 alkyl group having a C1 to C10 alkoxy group; each of $R^{13}$ and $R^{16}$ represents a hydrogen atom or a methyl group; each of $R^{14}$ and $R^{17}$ represents a C1 to C10 alkyl group or a C6 to C40 aryl group; $n^{12}$ is an integer of 1 to 3; $n^{13}$ is an integer of 2 to 5; $n^{14}$ is an integer of 0 to 3; $n^{15}$ is an integer of 0 to 3, with these ns having a relationship of $3 \le (n^{12}+n^{13}+n^{14}+n^{15}) \ge 6$; $n^{16}$ is an integer of 1 to 3; $n^{17}$ is an integer of 1 to 4; $n^{18}$ is an integer of 0 to 3; $n^{19}$ is an integer of 0 to 3, with these ns having a relationship of $2 \le (n^{16}+n^{17}+n^{18}+n^{19}) \le 5$; and $m^{12}$ is an integer of 2 to 10).

16 Claims, 1 Drawing Sheet

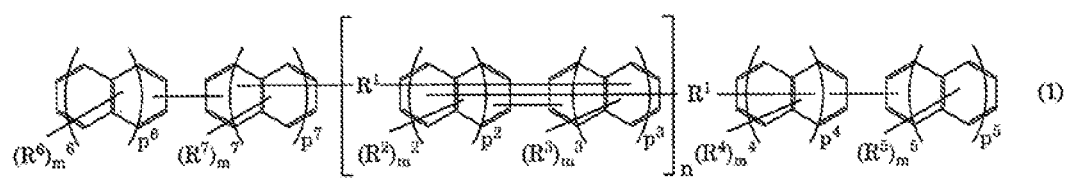
(1)
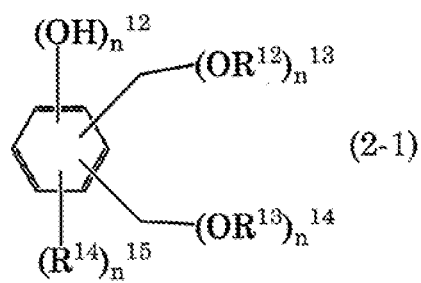
(2-1)
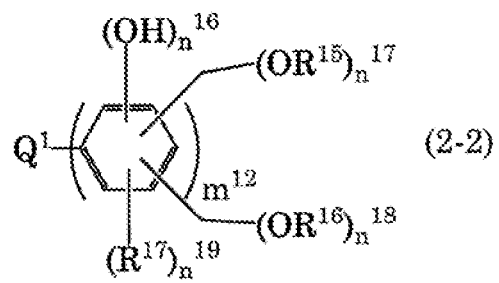
(2-2)

COMPOSITION FOR FORMING RESIST UNDERLAYER FILM, RESIST UNDERLAYER FILM, METHOD FOR FORMING RESIST PATTERN AND METHOD FOR PRODUCING SEMICONDUCTOR DEVICE

TECHNICAL FIELD

The present invention relates to a composition for forming a resist underlayer film (hereinafter referred to as a "resist underlayer film forming composition"), to a resist underlayer film, to a method for forming a resist pattern (hereinafter referred to as a "resist pattern formation method"), and to a method for producing a semiconductor device (hereinafter referred to as a "semiconductor device production method").

BACKGROUND ART

Conventionally, semiconductor devices have been micro-fabricated through lithography by use of a photoresist composition. Micro-fabrication is a processing technique including forming a thin film of a photoresist composition on a process substrate such as a silicon wafer; irradiating the photoresist film with an active ray such as a UV ray by the mediation of a mask pattern corresponding to a target semiconductor device pattern; developing; and etching the process substrate such as a silicon wafer with an obtained photoresist pattern as a protective film. Meanwhile, in recent years, the active ray employed has become to have a shorter wavelength (i.e., KrF excimer laser beam (248 nm) to ArF excimer laser beam (193 nm)) as the integration factor of semiconductor devices increases. As a result, irregular reflection of the active ray by the substrate as well as standing waves become serious problems. In order to mitigate such problems, there has been frequently employed a technique of providing a resist underlayer film, a so-called bottom anti-reflective coating (BARC), between a photoresist and a process substrate.

Separately, there is developed another lithographic technique employing, as an active ray, an extreme ultraviolet beam (EUV, 13.5 nm) or an electron beam (EB) for attaining finer micro-fabrication. In EUV lithography or EB lithography, generally, neither irregular reflection of the active ray by the substrate nor a standing wave is generated, whereby no particular anti-reflection film is needed. However, resist underlayer film is now widely investigated as an auxiliary film for improving resolution and adhesion of the resist pattern.

As the material of such a resist underlayer film intervening between a photoresist and a process substrate, there is disclosed, for example, a material for forming a lithography underlayer, which material has excellent heat resistance and etching resistance (see, for example, Patent Document 1). However, according to demand for higher heat resistance, there is expected a composition for a resist underlayer film having further enhanced heat resistance.

PRIOR ART DOCUMENTS

Patent Documents

[Patent Document 1]
WO 2016/143635, pamphlet

SUMMARY OF THE INVENTION

Problems to be Solved by the Invention

The present invention has been conceived under such circumstances. Thus, an object of the present invention is to provide a resist underlayer film forming composition having improved heat resistance, a resist underlayer film, a resist pattern formation method, and a semiconductor device production method.

Means for Solving the Problems

The present inventors have conducted extensive studies and have found that a resist underlayer film employing a compound having a specific structure in combination with a specific cross-linking agent successfully reduces, as compared with a conventional technique, the amount of sublimation matter which is generated in forming a resist underlayer film by baking a coating film of the corresponding resist underlayer film forming composition. The present invention has been accomplished on the basis of this finding.

Accordingly, a first mode of the present invention to attain the aforementioned object provides a resist underlayer film forming composition characterized by comprising (A) a compound represented by formula (1):

[F1]

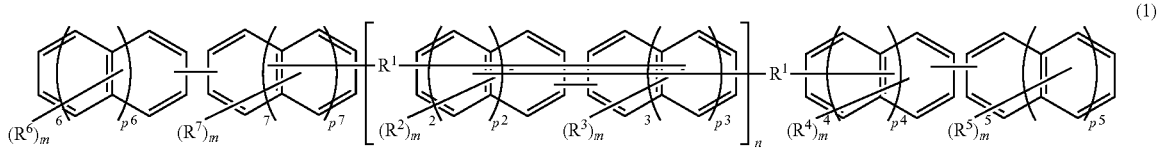

(wherein, independently, $R^1$ represents a C1 to C30 divalent group; each of $R^2$ to $R^7$ represents a C1 to C10 linear, branched, or cyclic alkyl group, a C6 to C10 aryl group, a C2 to C10 alkenyl group, a thiol group, or a hydroxyl group; at least one $R^5$ is a hydroxyl group or a thiol group; each of $m^2$, $m^3$, and $m^6$ is an integer of 0 to 9; each of $m^4$ and $m^7$ is an integer of 0 to 8; $m^5$ is an integer of 1 to 9; n is an integer of 1 to 4; and each of $p^2$ to $p^7$ is an integer of 0 to 2) and (B) a cross-linkable compound represented by formula (2-1) or (2-2):

[F2]

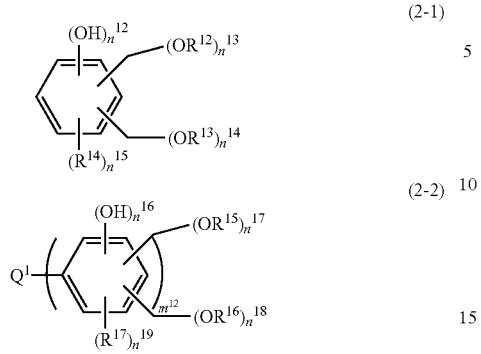

(wherein $Q^1$ represents a single bond or an $m^{12}$-valent organic group; each of $R^{12}$ and $R^{15}$ independently represents a C2 to C10 alkyl group or a C2 to C10 alkyl group having a C1 to C10 alkoxy group; each of $R^{13}$ and $R^{16}$ represents a hydrogen atom or a methyl group; each of $R^{14}$ and $R^{17}$ represents a C1 to C10 alkyl group or a C6 to C40 aryl group; $n^{12}$ is an integer of 1 to 3; $n^{13}$ is an integer of 2 to 5; $n^{14}$ is an integer of 0 to 3; $n^{15}$ is an integer of 0 to 3, with these ns having a relationship of $3 \le (n^{12}+n^{13}+n^{14}+n^{15}) \le 6$; $n^{16}$ is an integer of 1 to 3; $n^{17}$ is an integer of 1 to 4; $n^{18}$ is an integer of 0 to 3; $n^{19}$ is an integer of 0 to 3, with these ns having a relationship of $2 \le (n^{16}+n^{17}+n^{18}+n^{19}) \le 5$; and $m^{12}$ is an integer of 2 to 10).

A second mode of the present invention to attain the aforementioned object provides a resist underlayer film forming composition characterized by comprising (A) a compound represented by formula (1):

[F3]

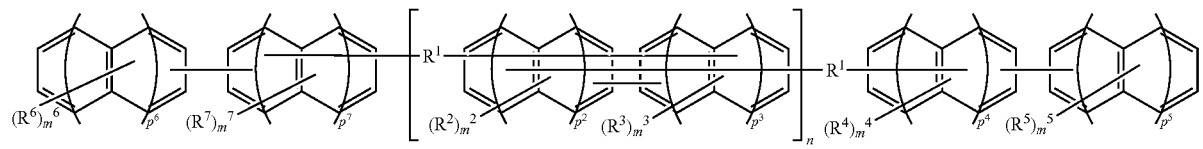

(wherein, independently, $R^1$ represents a C1 to C30 divalent group; each of $R^2$ to $R^7$ represents a C1 to C10 linear, branched, or cyclic alkyl group, a C6 to C10 aryl group, a C2 to C10 alkenyl group, a thiol group, or a hydroxyl group; at least one $R^5$ is a hydroxyl group or a thiol group; each of $m^2$, $m^3$, and $m^6$ is an integer of 0 to 9; each of $m^4$ and $m^7$ is an integer of 0 to 8; $m^5$ is an integer of 1 to 9; n is an integer of 0 to 4; and each of $p^2$ to $p^7$ is an integer of 0 to 2), (C) a cross-linkable compound which is one or more compounds selected from among a melamine compound, a guanamine compound, a glycoluril compound, a urea compound, an epoxy compound, a thioepoxy compound, an isocyanate compound and an azide compound, and (D) a cross-linking catalyst which is one or more compounds selected from among p-toluenesulfonic acid, trifluoromethanesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-napthalenesulfonic acid, pyridinium trifluoromethanesulfonate, pyridinium p-phenolsulfonate, citric acid, benzoic acid, hydroxybenzoic acid, napthalenecarboxylic acid, 2,4,4,6-tetrabromocyclohexadienone, benozin tosylate, 2-nitrobenzyl tosylate, pyridinium p-toluenesulfonate, trifluoromethanesulfonic acid partially or totally blocked with a quaternary element, hexafluoroantimonic acid partially or totally blocked with a quaternary element, dodecylbenzenesulfonic acid partially or totally blocked with an amine, an aromatic sulfonium hexafluorophosphate, and an aromatic sulfonium hexafluoroantimonate.

A third mode of the present invention to attain the aforementioned object is directed to a specific embodiment of the resist underlayer film forming composition of the first mode, wherein the composition further comprises (E) a cross-linking catalyst.

A fourth mode of the present invention to attain the aforementioned object provides a resist underlayer film characterized by being a baked product of a coating film formed of a resist underlayer film forming composition of any of the first to third modes.

A fifth mode of the present invention to attain the aforementioned object provides a resist pattern formation method characterized by comprising a step of applying on a semiconductor substrate a resist underlayer film forming composition of any of the first to third modes; a step of baking the composition to thereby form a resist underlayer film; and using the film in semiconductor production.

A sixth mode of the present invention to attain the aforementioned object provides a semiconductor device production method characterized by comprising a step of forming, on a semiconductor substrate, a resist underlayer film from a resist underlayer film forming composition of any of the first to third modes; a step of forming a resist film on the resist underlayer film; a step of forming a resist pattern through exposure to light or electron beam and development; a step of etching the resist underlayer film by the mediation of the formed resist pattern; and a step of processing the semiconductor substrate through the patterned resist underlayer film.

A seventh mode of the present invention to attain the aforementioned object provides a semiconductor device production method characterized by comprising a step of forming a resist underlayer film from a resist underlayer film forming composition of any of the first to third modes; a step of forming a hard mask on the resist underlayer film; a step of forming a resist film on the hard mask; a step of forming a resist pattern through exposure to light or electron beam and development; a step of etching the hard mask by the mediation of the formed resist pattern; a step of etching the resist under layer film by the mediation of the patterned hard mask; and a step of processing the semiconductor substrate through the patterned resist underlayer film.

An eighth mode of the present invention to attain the aforementioned object is directed to a specific embodiment of the semiconductor device production method of the seventh mode, wherein the hard mask is formed through application or vapor deposition of an inorganic substance.

Effects of the Invention

The present invention enables provision of a resist underlayer film forming composition having improved heat resistance, a resist underlayer film having improved heat resistance, a resist pattern formation method, and a semiconductor device production method.

MODES FOR CARRYING OUT THE INVENTION

Next, an embodiment of the present invention will be described in detail. However, the embodiment should not be construed as limiting the present invention thereto.
(Resist Underlayer Film Forming Composition)

The resist underlayer film forming composition of the present embodiment contains (A) a compound having a specific structure and (B) a cross-linkable compound having a specific structure.

The compound having a specific structure (A) contained in the resist underlayer film forming composition is a compound represented by formula (1) (hereinafter referred to as "compound (A)").

affect the desired effect of the resist underlayer film forming composition containing compound (A). So long as compound (A) has a structure represented by formula (1), the resist underlayer film forming composition containing compound (A) can be advantageously applied to a wet process and exhibit excellent heat resistance and etching resistance.

Compound (A) has high heat resistance by virtue of rigidity of its structure, although the molecular weight thereof is somewhat low. Thus, compound (A) can be used under high-temperature baking conditions. Also, since the molecular weight and viscosity is comparatively low, compound (A) can be easily applied to a substrate having steps (in particular, very small space, hole pattern, etc.) and charged uniformly and thoroughly into the spaces defined by the steps. As a result, the filling performance of the resist underlayer film forming composition containing compound (A) can be readily enhanced, which is advantageous. The flatness of the thus-formed resist underlayer film is satisfactory. The resultant resist film can be endowed with high etching resistance. In the present embodiment, the molecular weight of compound (A) is preferably 500 to 5,000, more preferably 500 to 2,000.

From the viewpoints of easiness of cross-linking and solubility in solvent, at least one $R^6$ in compound (A) is

[F4]

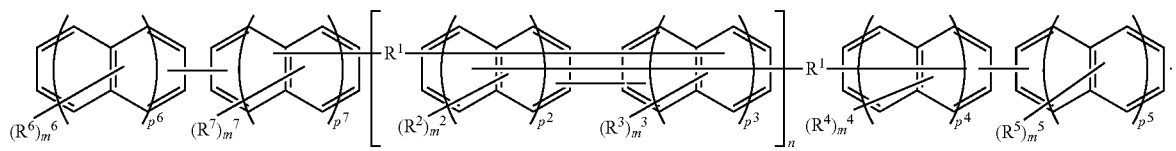

(1)

In formula (1), independently, $R^1$ represents a C1 to C30 divalent group. In the structure of compound (A), aromatic rings are linked via $R^1$s. Each of $R^2$ to $R^7$ represents a C1 to C10 linear, branched, or cyclic alkyl group, a C6 to C10 aryl group, a C2 to C10 alkenyl group, a thiol group, or a hydroxyl group, and at least one $R^5$ is a hydroxyl group or a thiol group. Each of $m^2$, $m^3$, and $m^6$ is an integer of 0 to 9; each of $m^4$ and $m^7$ is an integer of 0 to 8; and $m^5$ is an integer of 1 to 9. n is an integer of 0 to 4, and each of $p^2$ to $p^7$ is an integer of 0 to 2.

The compound (A) of the present invention includes a corresponding compound (n=0) at a ratio of 50%, preferably ≥60%.

No particular limitation is imposed on the divalent group, and an example thereof is a C1 to C30 alkylene group. Examples of the C1 to C30 alkylene group include those having a linear hydrocarbyl group or a branched hydrocarbyl group. The divalent group may have a C6 to C30 aromatic group.

Also, the divalent group may have a double bond or a heteroatom. The structure of the divalent group does not preferably a hydroxyl group or a thiol group. From the same viewpoints, at least one $R^2$ and/or at least one $R^3$ is more preferably a hydroxyl group and/or a thiol group, most preferably a hydroxyl group.

From the viewpoint of availability of the raw material of compound (A), compound (A) is more preferably a compound represented by formula (1-A).

[F5]

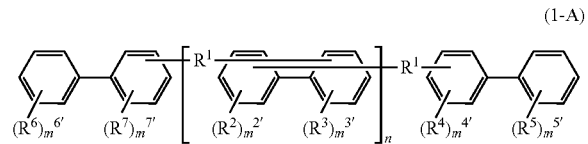

(1-A)

In formula (1-A), $R^1$ to $R^7$ and n have the same meanings as defined in formula (1). Each of $m^{2'}$, $m^{3'}$ and $m^{6'}$ is an integer of 0 to 5; $m^4$ and $m^7$ is an integer of 0 to 4; and $m^Y$ is an integer of 1 to 5.

The compound represented by formula (1-A) is more preferably a compound represented by formula (1-B), from the viewpoint of solubility in solvent.

[F6]

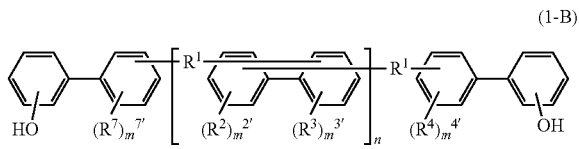
(1-B)

In formula (1-B), $R^1$ to $R^4$, $R^7$, and n have the same meanings as defined in formula (1). Also, $m^{2'}$ to $m^{4'}$, and $m^{7'}$ have the same meanings as defined in formula (1-A).

The compound represented by formula (1-B) is more preferably a compound represented by formula (1-C), from the viewpoint of further solubility in solvent.

[F7]

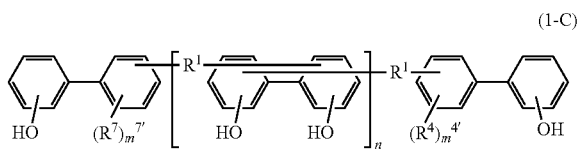
(1-C)

In formula (1-C), $R^1$, $R^4$, $R^7$, and n have the same meanings as defined in formula (1). Also, $m^{4'}$ and $m^{7'}$ have the same meanings as defined in formula (1-A).

The compound represented by formula (1-C) is more preferably a compound represented by formula (1-D), from the viewpoint of easiness of synthesis.

[F8]

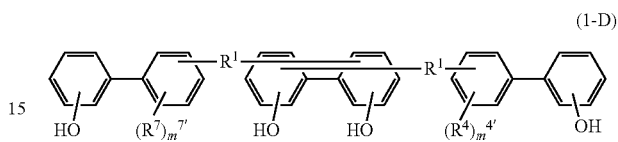
(1-D)

In formula (1-D), $R^1$, $R^4$, and $R^7$ have the same meanings as defined in formula (1). Also, $m^{4'}$ and $m^{7'}$ have the same meanings as defined in formula (1-A).

The compound represented by formula (1-D) is more preferably a compound represented by formula (1-E), from the viewpoint of availability of the raw material thereof.

[F9]

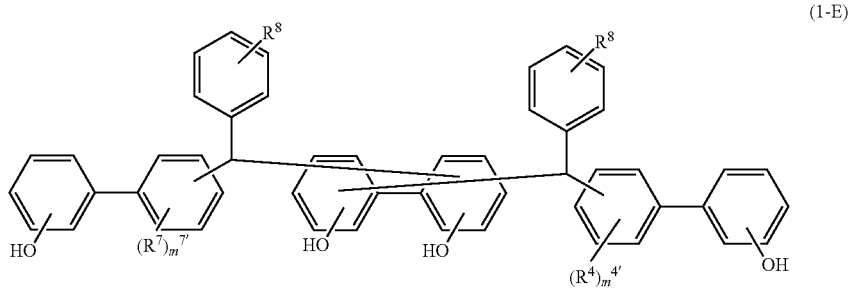
(1-E)

In formula (1-E), $R^4$ and $R^7$ have the same meanings as defined in formula (1). $R^8$ represents a C1 to C10 linear, branched, or cyclic alkyl group, a C6 to C10 aryl group, or a C2 to C10 alkenyl group. Also, $m^{4'}$ and $m^{7'}$ have the same meanings as defined in formula (1-A).

The compound represented by formula (1-E) is particularly preferably a compound represented by formula (1-F), from the viewpoint of further solubility in solvent.

[F10]

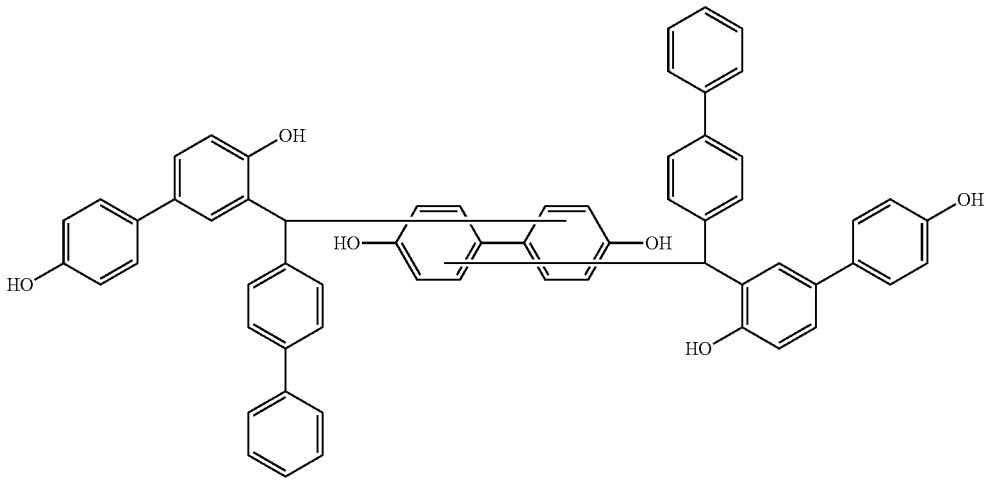
(1-F)

The compound represented by formula (1-C) is particularly preferably a compound represented by formula (1-G), from the viewpoint of further solubility in solvent.
[F11]
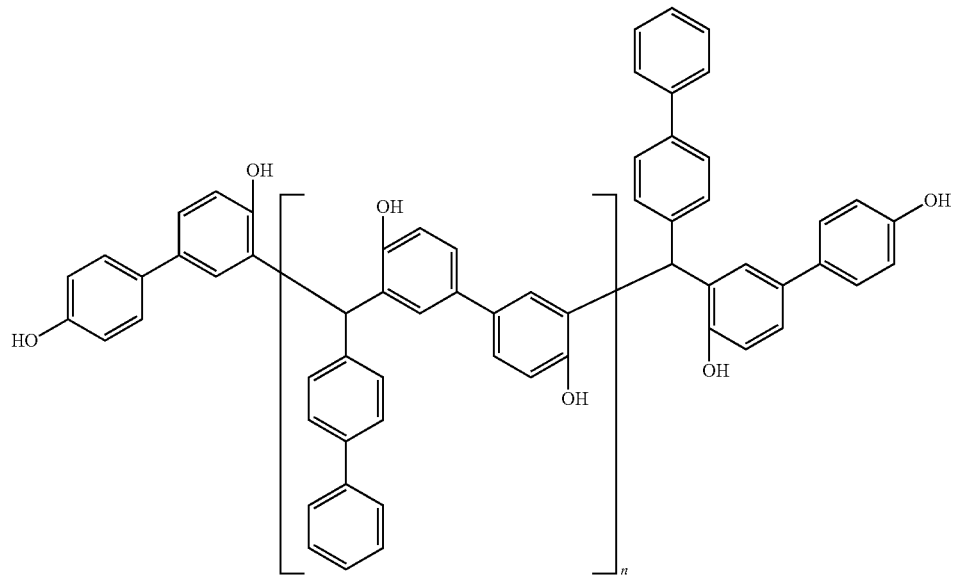
(1-G)
n = 0 (≥50%), n = 1-4 (<50%)
Specific examples of compound (A) include, but are not limited to, compound groups A to Q.
[F12]
<Compound group A>
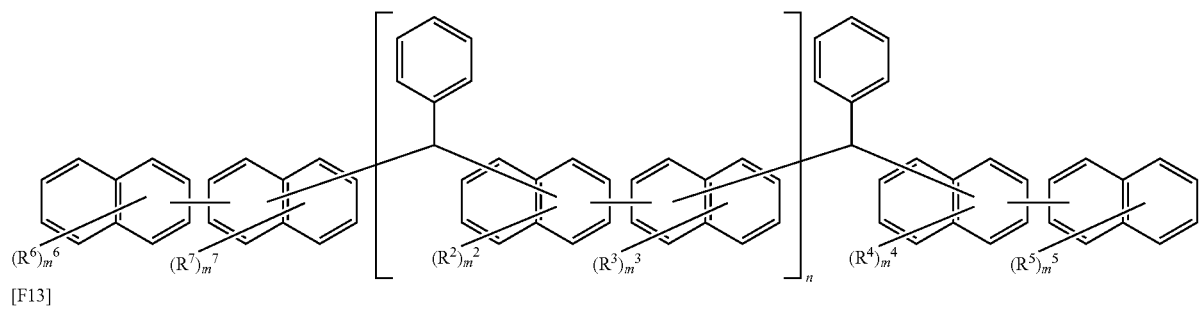
[F13]
<Compound group B>
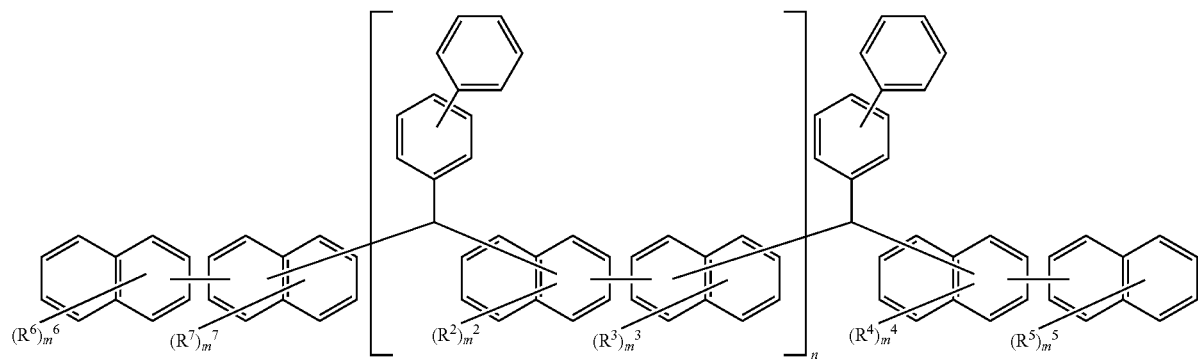

-continued
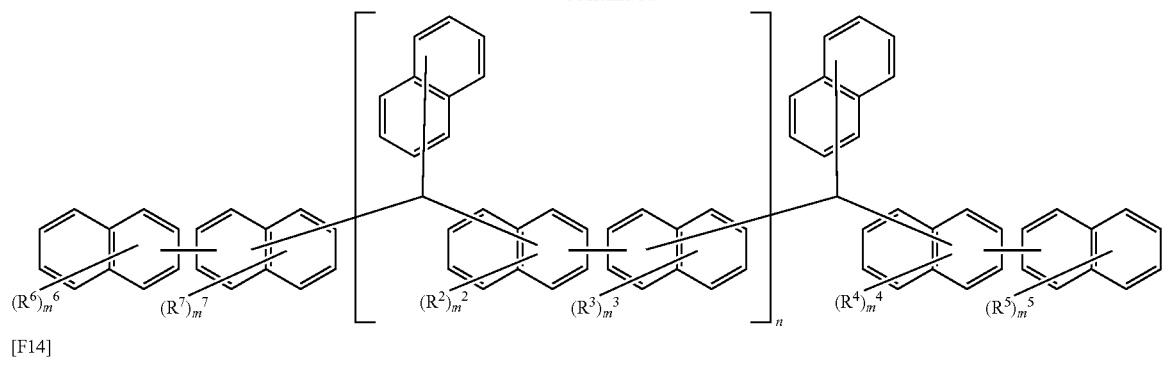
<Compound group C>
[F14]
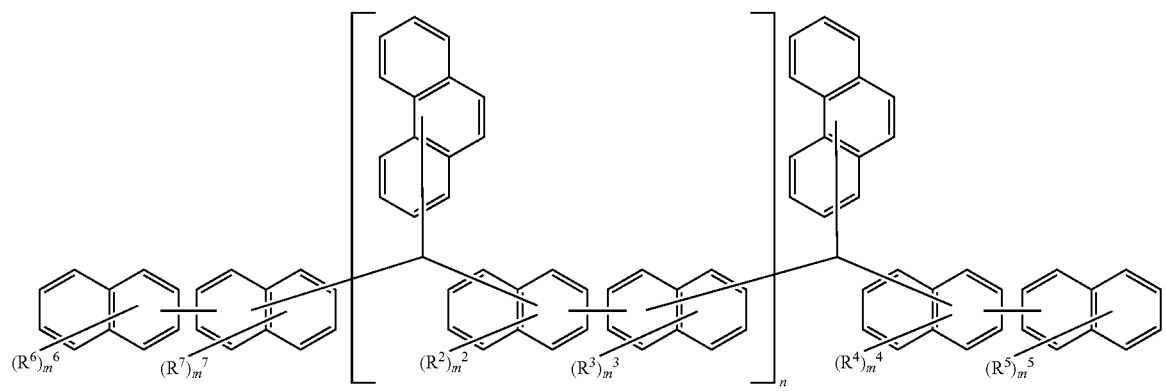
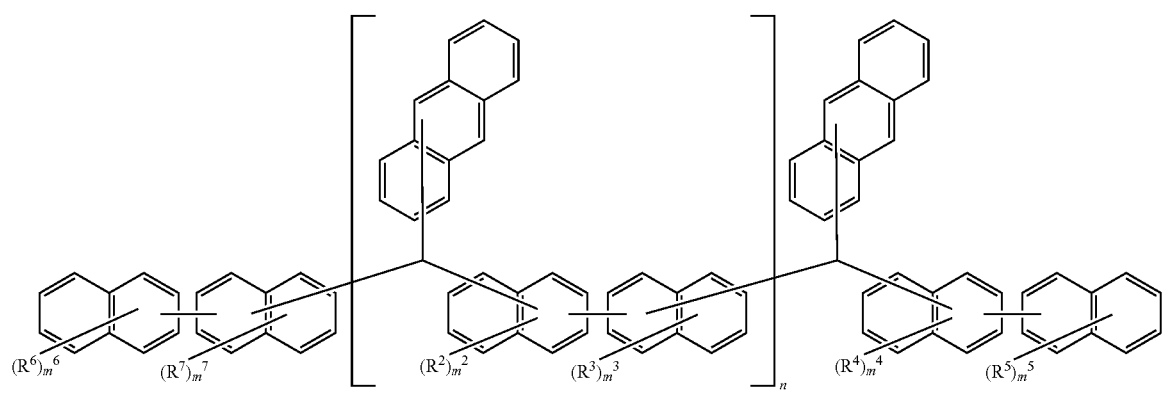
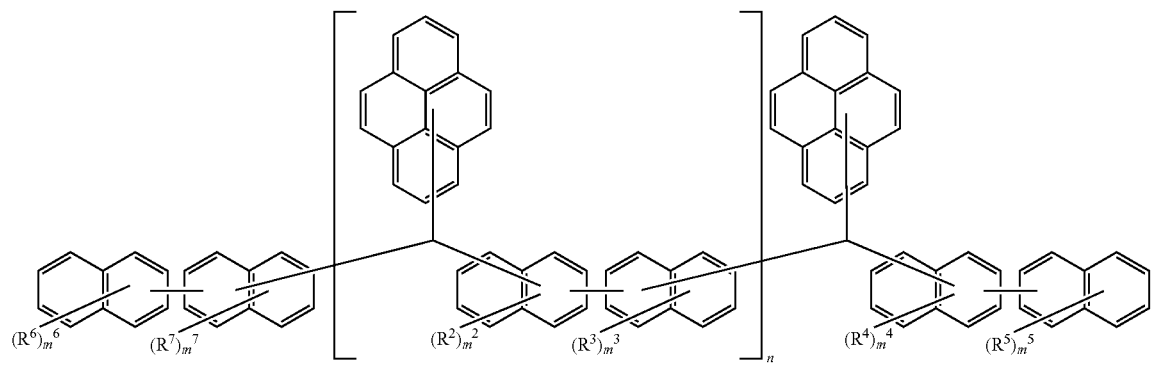

[F15]
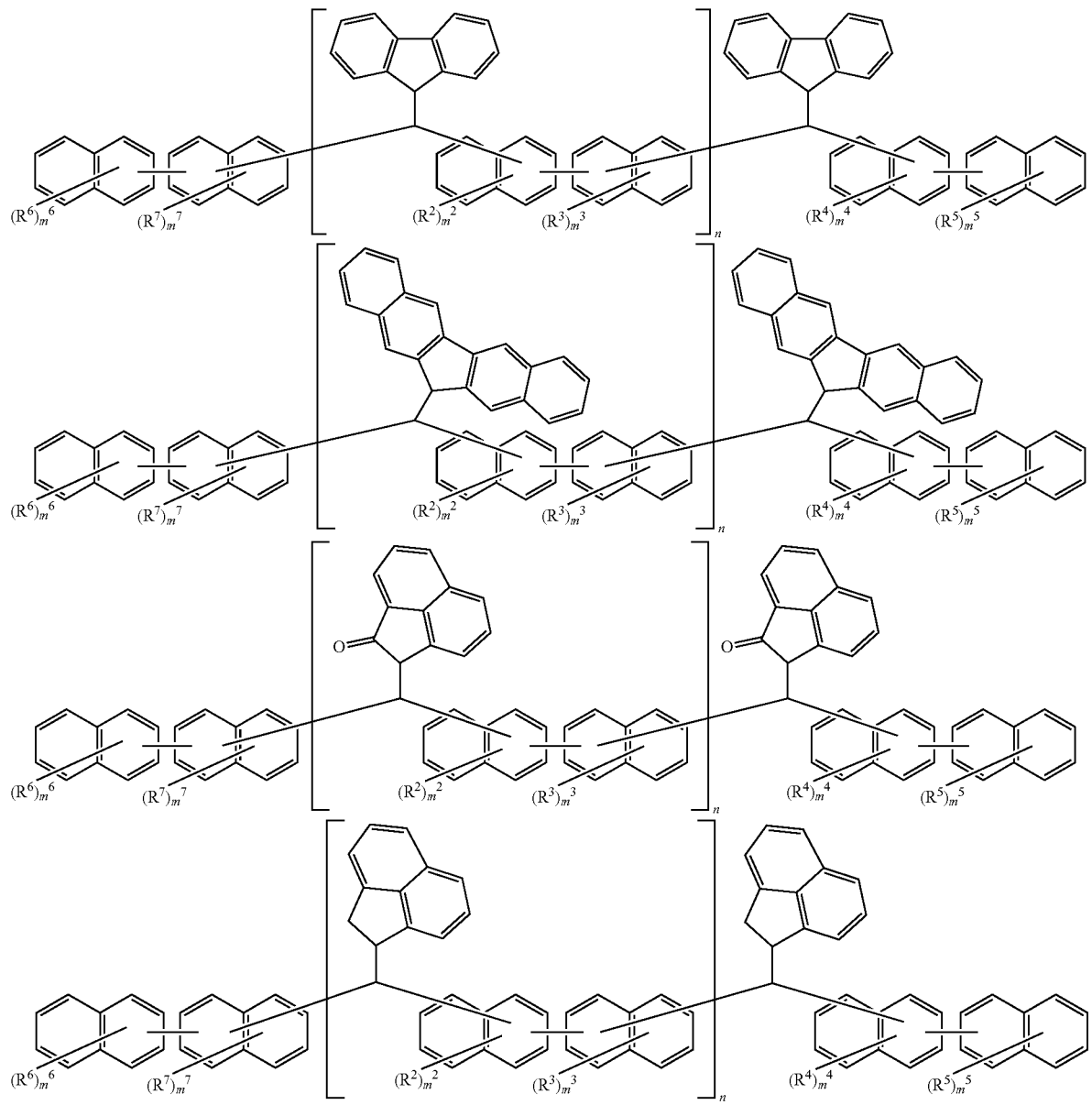
<Compound group D>
In the above compound groups A to D, $R^2$ to $R^7$, $m^2$ to $m^7$, and n have the same meanings as defined in formula (1).

[F16]
<Compound group E>
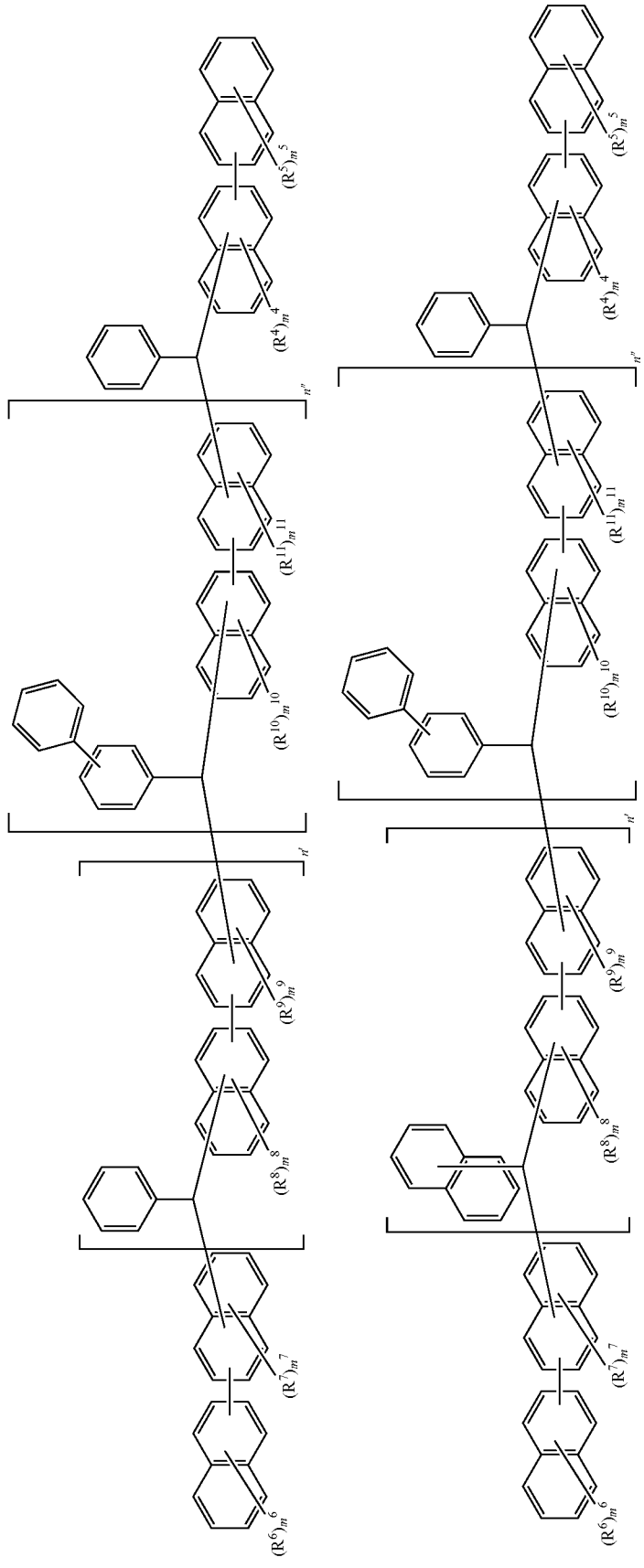

In compound group E, $R^4$ to $R^7$, and $m^4$ to $m^7$ have the same meanings as defined in formula (1). n' is an integer of 0 to 3, and n" is an integer of 1 to 4. The sequence of the repeating units is arbitrarily set. Each of $R^8$ to $R^{11}$ is a C1 to C10 linear, branched, or cyclic alkyl group, C6 to C10 aryl group, a C2 to C10 alkenyl group, a thiol group, or a hydroxyl group. Each of $m^8$ to $m^{11}$ is an integer of 0 to 6.

[F17]

<Compound group F>

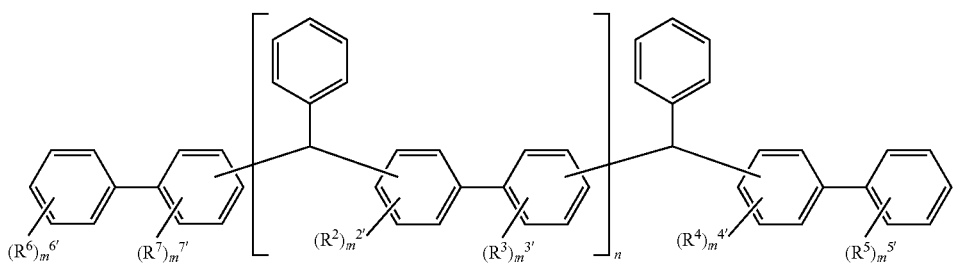

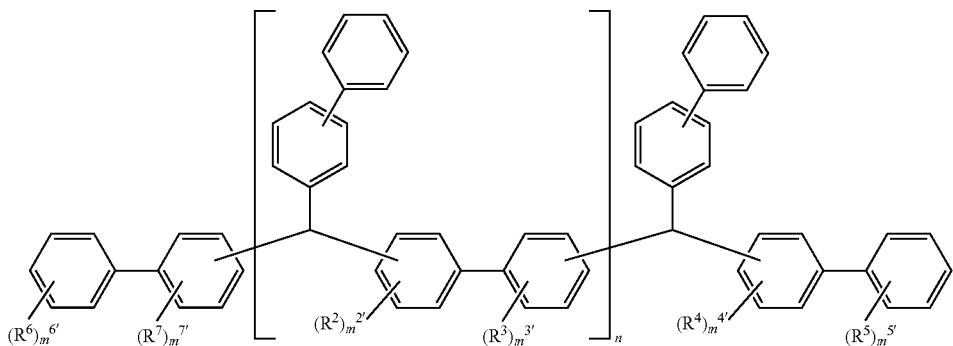

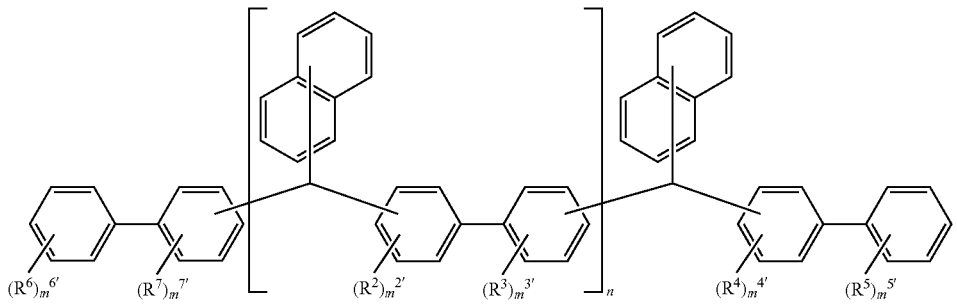

[F18]

<Compound group G>

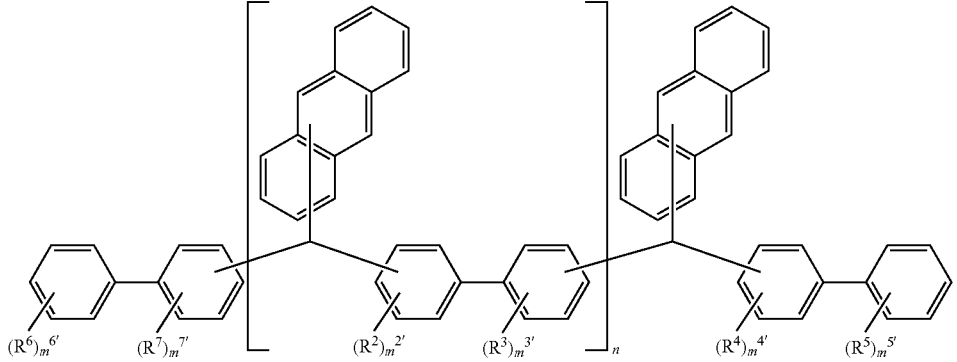

-continued
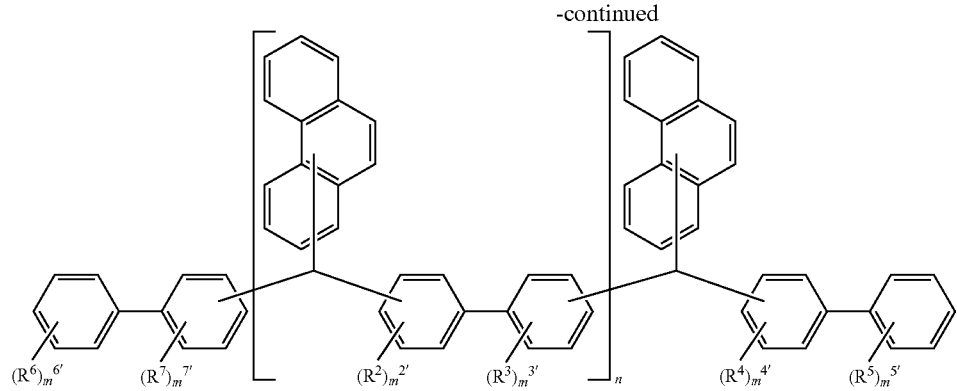
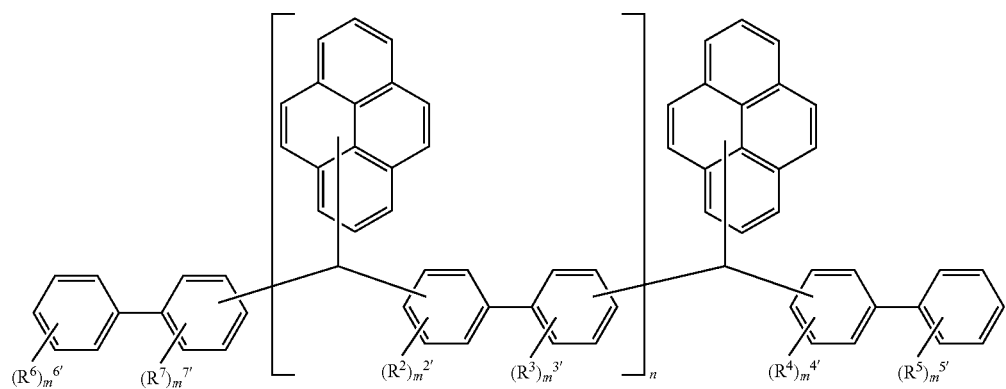
[F19]
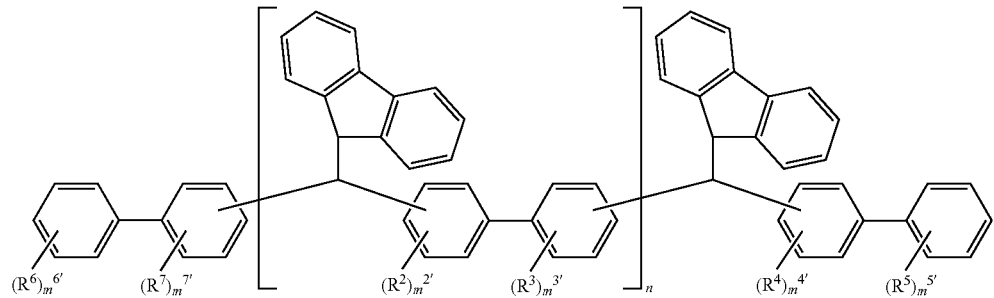
<Compound group H>
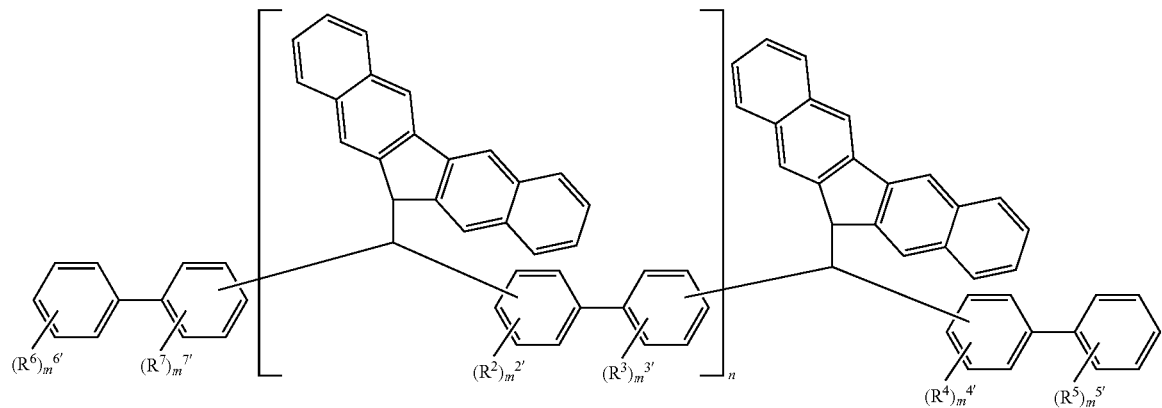

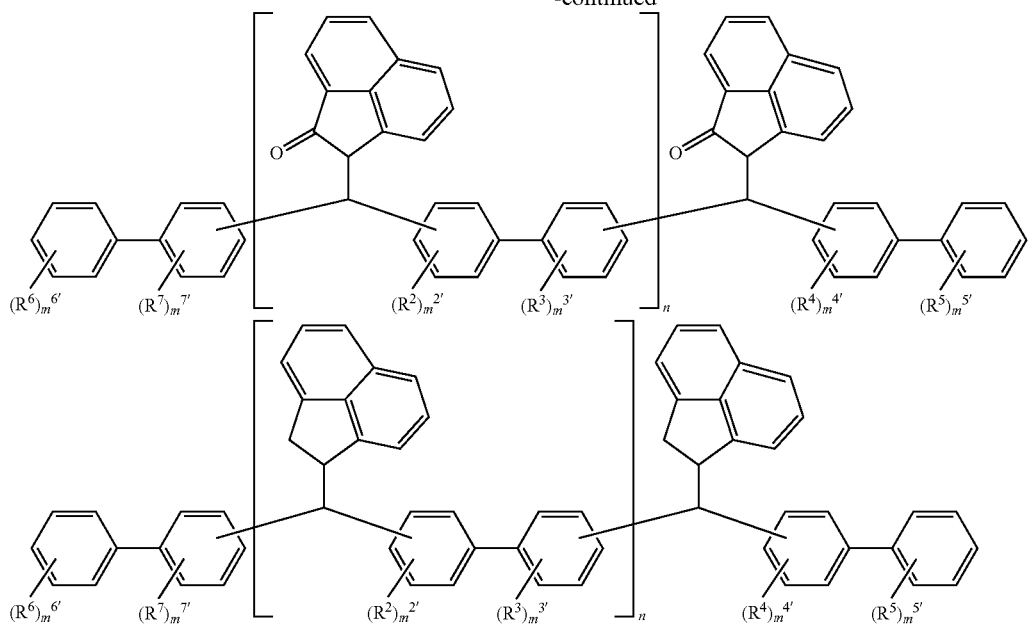

In compound groups F to H, $R^2$ to $R^7$, and n have the same meanings as defined in formula (1). $m^{2'}$ to $m^{7'}$ are the same as described in relation to formula (1-A).

[F20] <Compound group I>

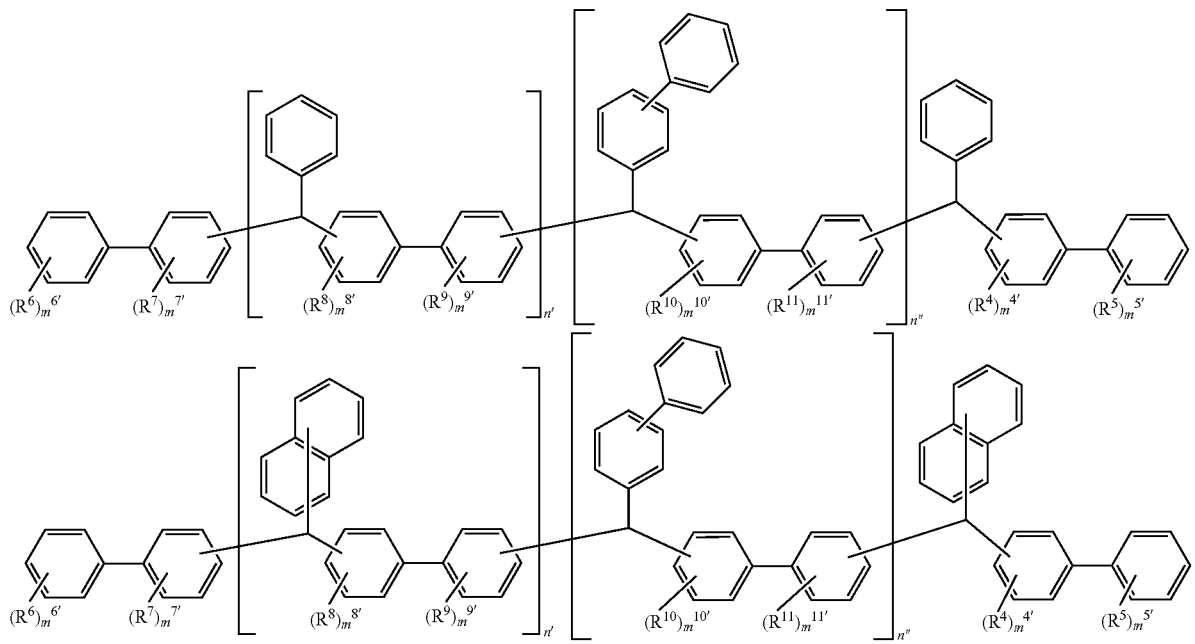

In compound group I, $R^4$ to $R^7$ have the same meanings as defined in formula (1). $m^{4'}$ to $m^{7'}$ are the same as described in relation to formula (1-A). n' is an integer of 0 to 3, and n" is an integer of 1 to 4. The sequence of the repeating units is arbitrarily set. Each of $R^8$ to $R^{11}$ is a C1 to C10 linear, branched, or cyclic alkyl group, a C6 to C10 aryl group, a C2 to C10 alkenyl group, a thiol group, or a hydroxyl group. Each of $m^{8'}$ to $m^{11'}$ is an integer of 0 to 4.

<Compound group J>
[F21]
[F22]
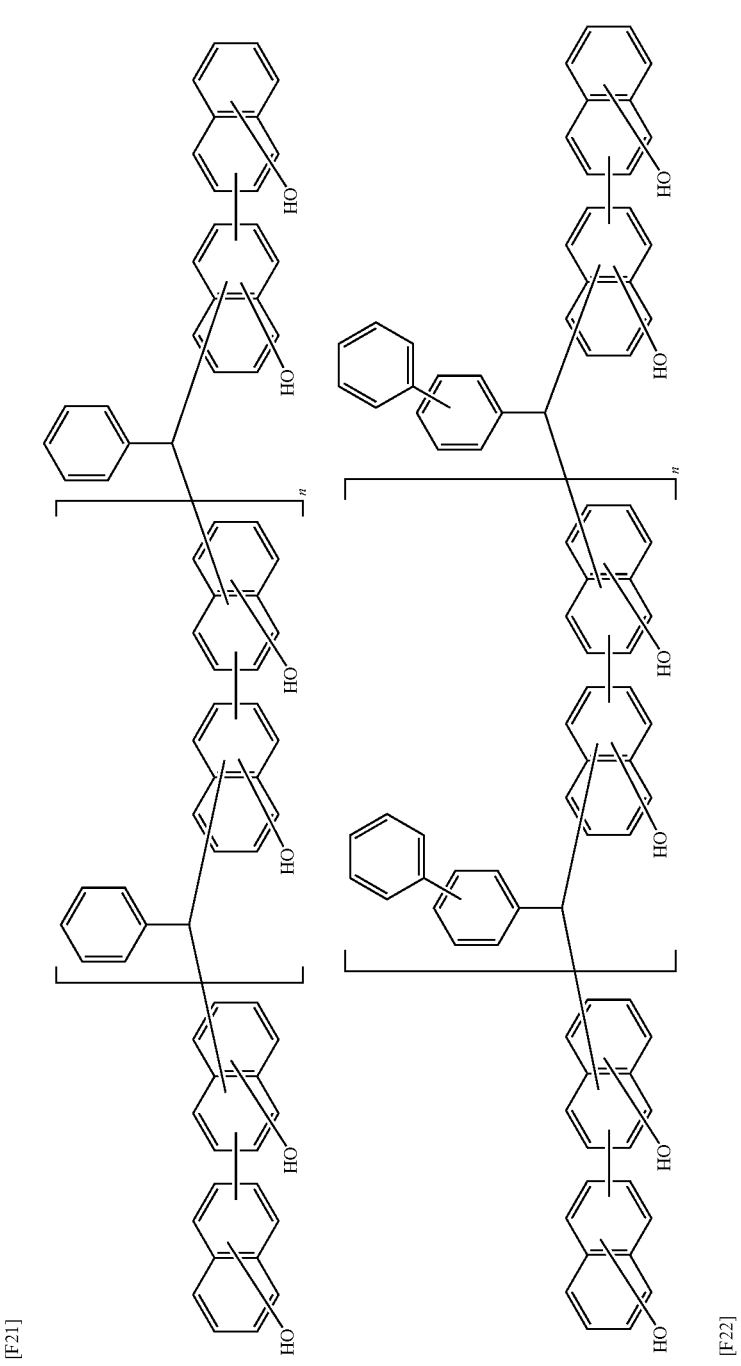

<Compound group K>
-continued
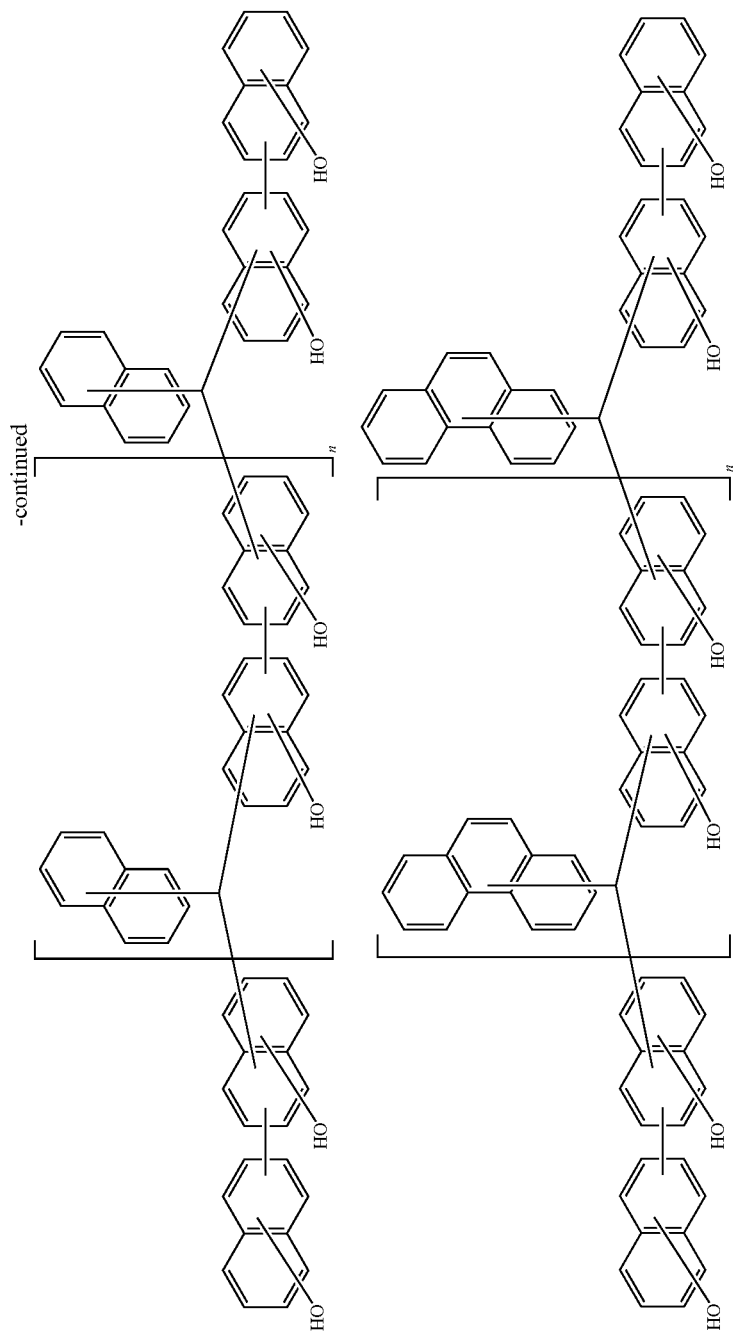

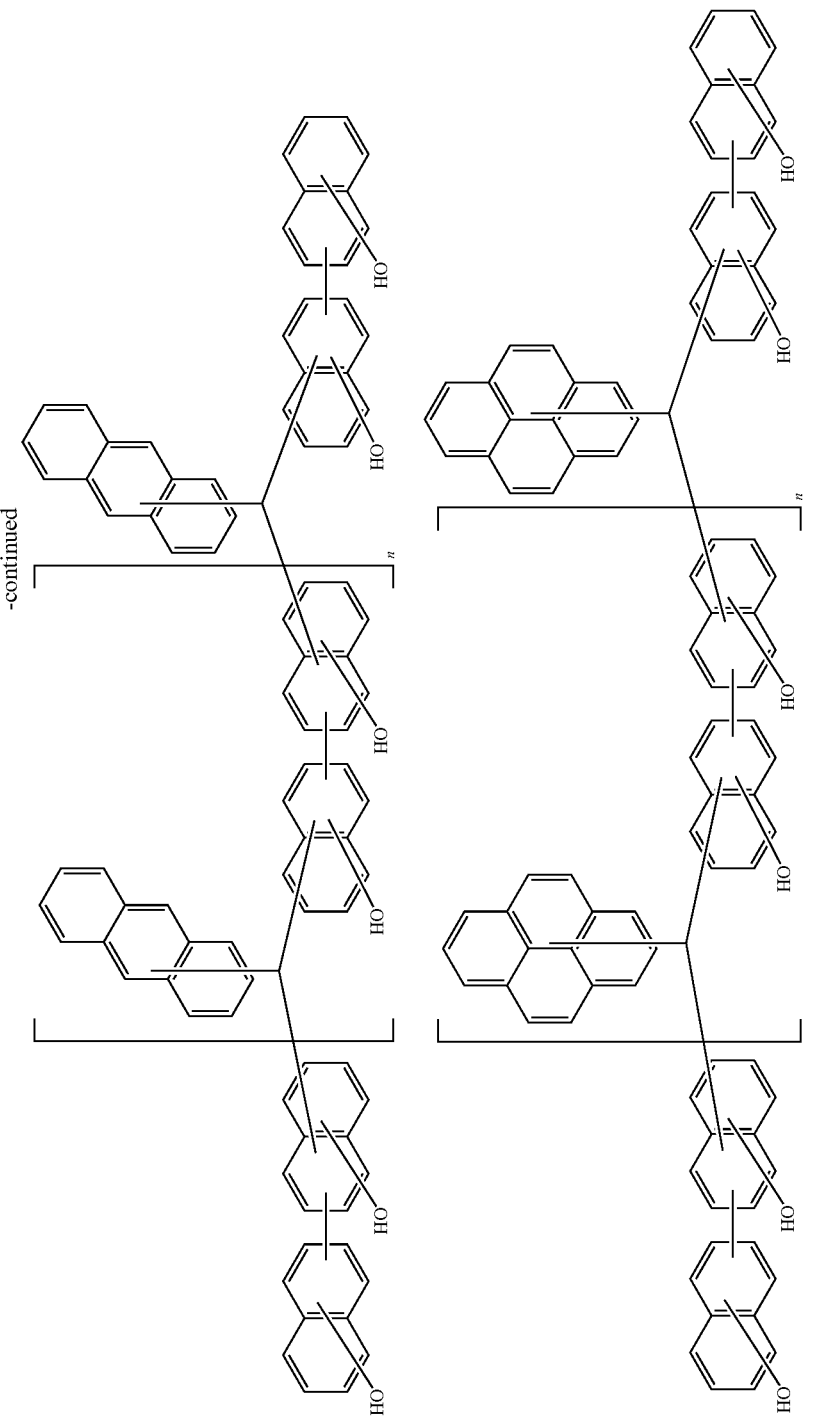

-continued
<Compound group L>
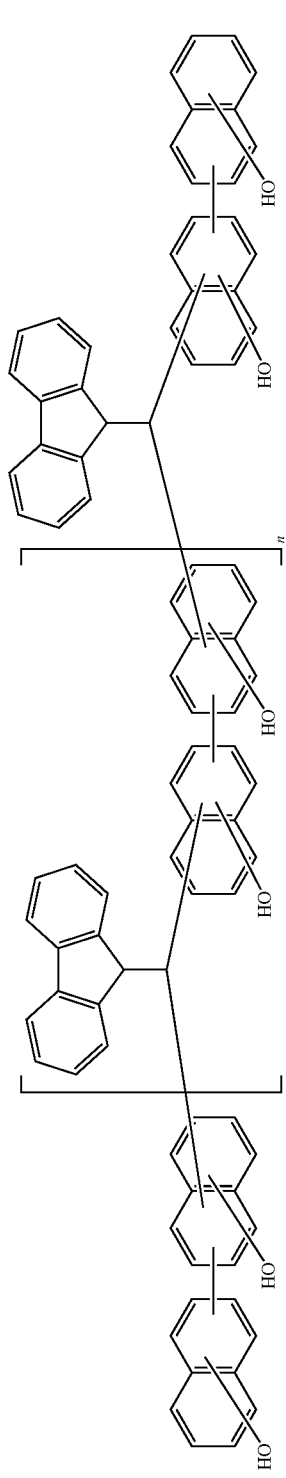
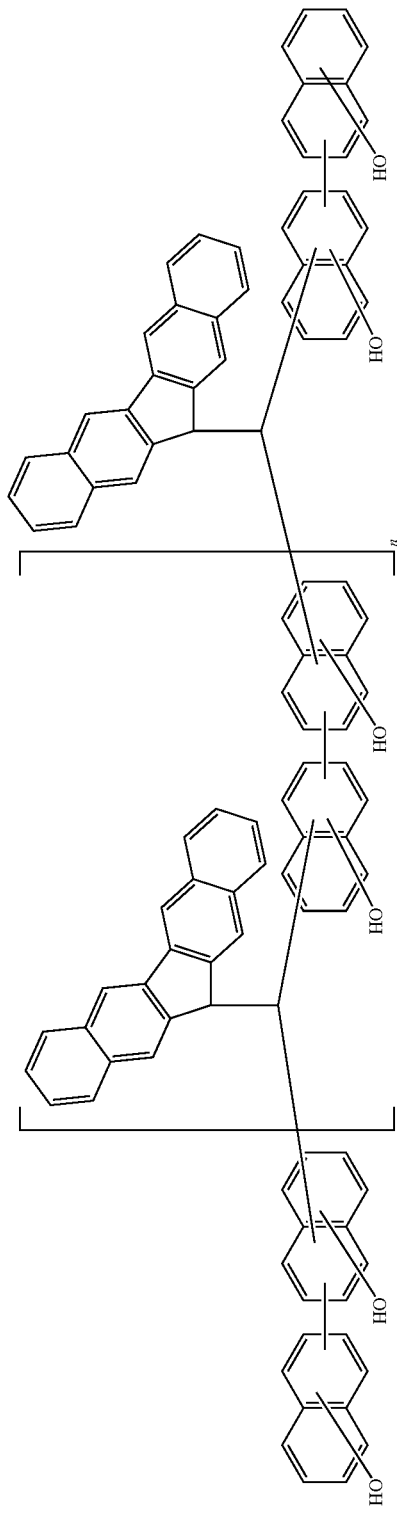

-continued
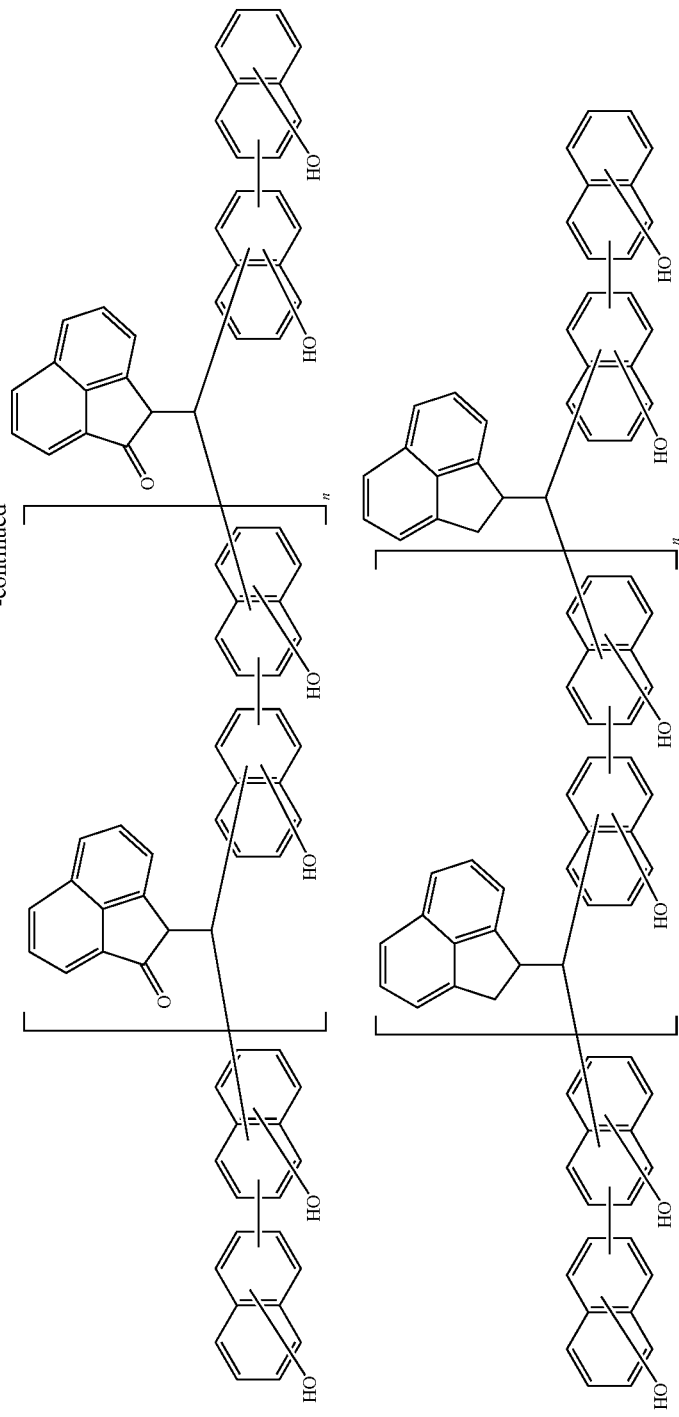
[F24]

<Compound group M>
-continued
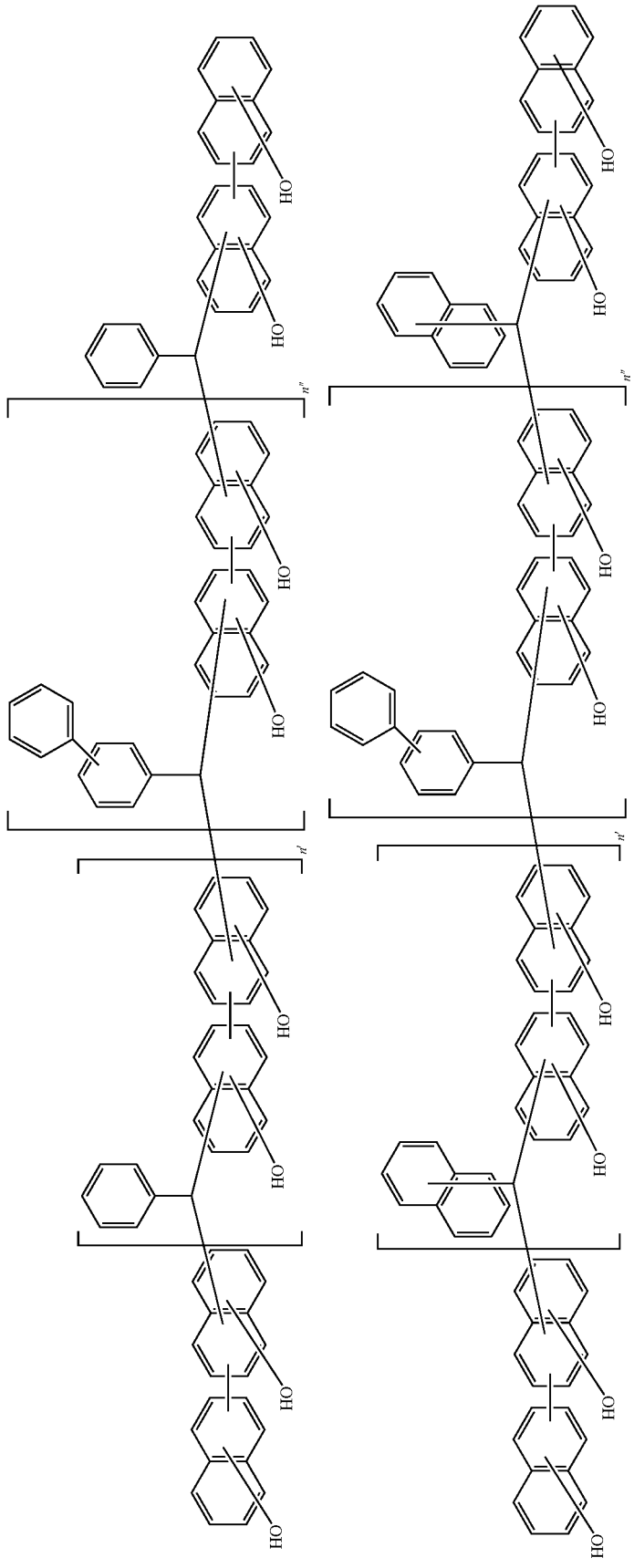
[F25]

-continued
<Compound group N>
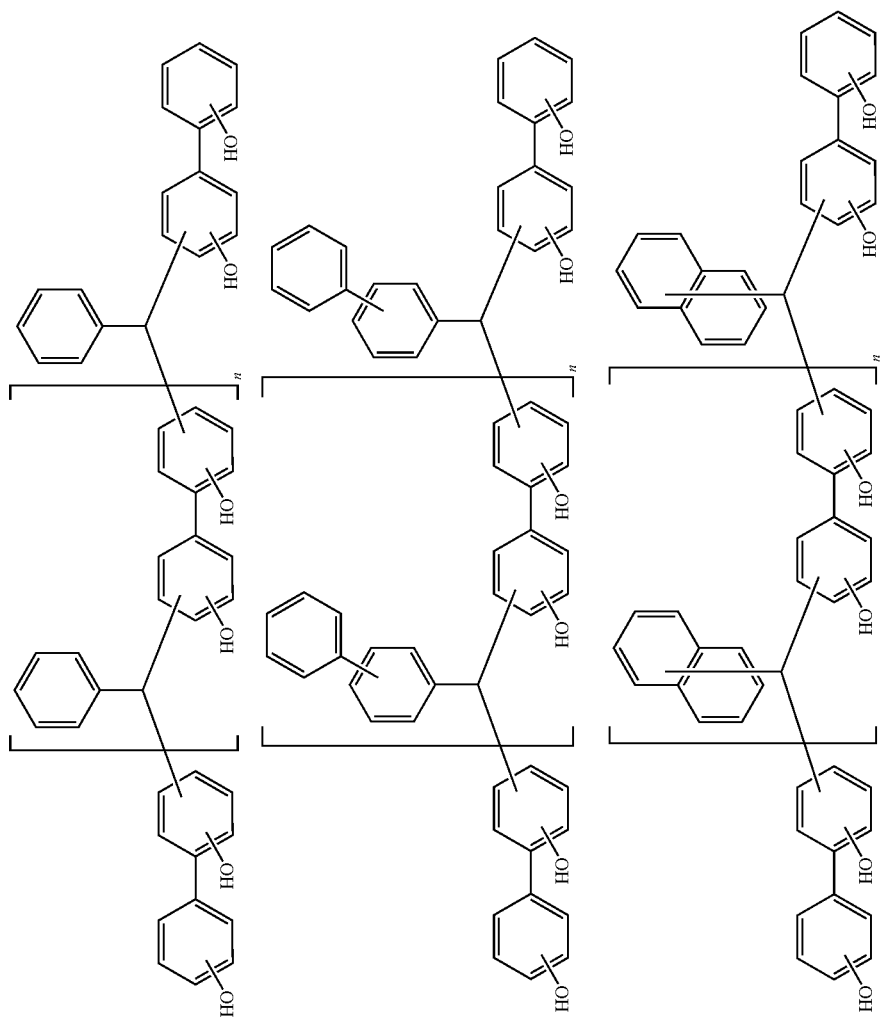
[F26]

<Compound group O>
-continued
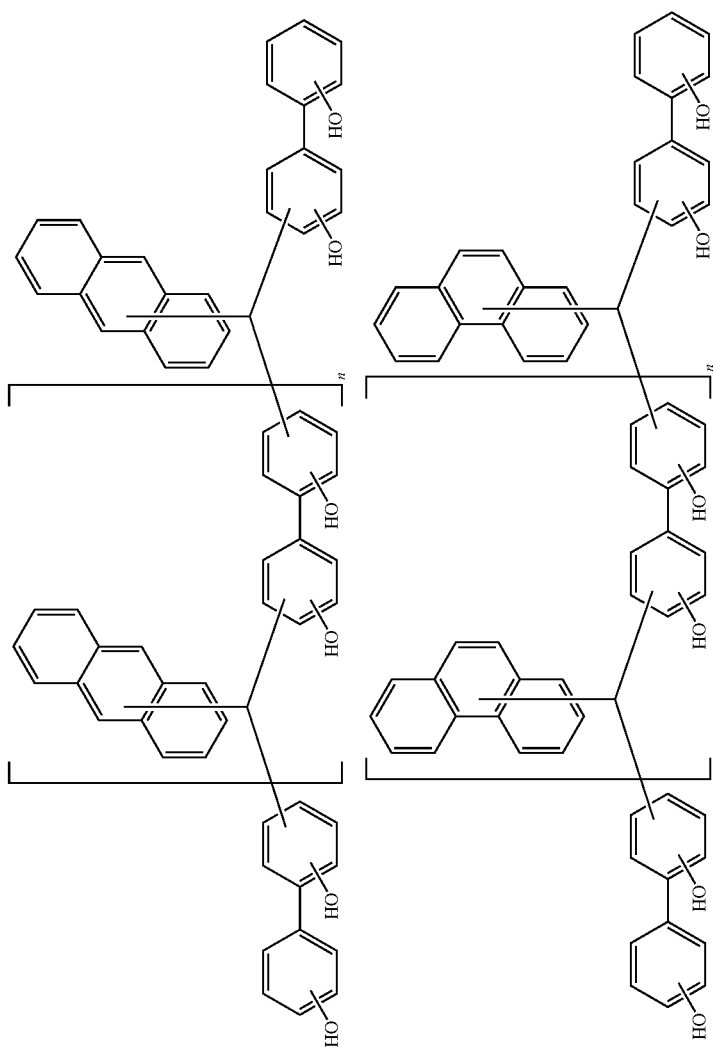

-continued
<Compound group P>
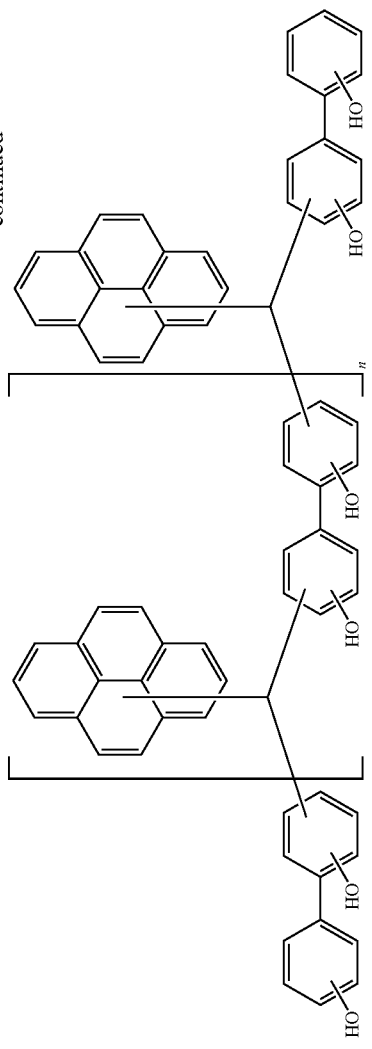
[F27]
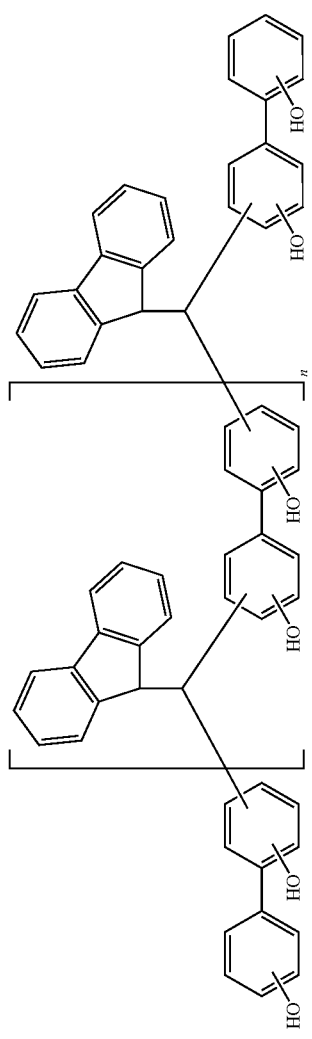

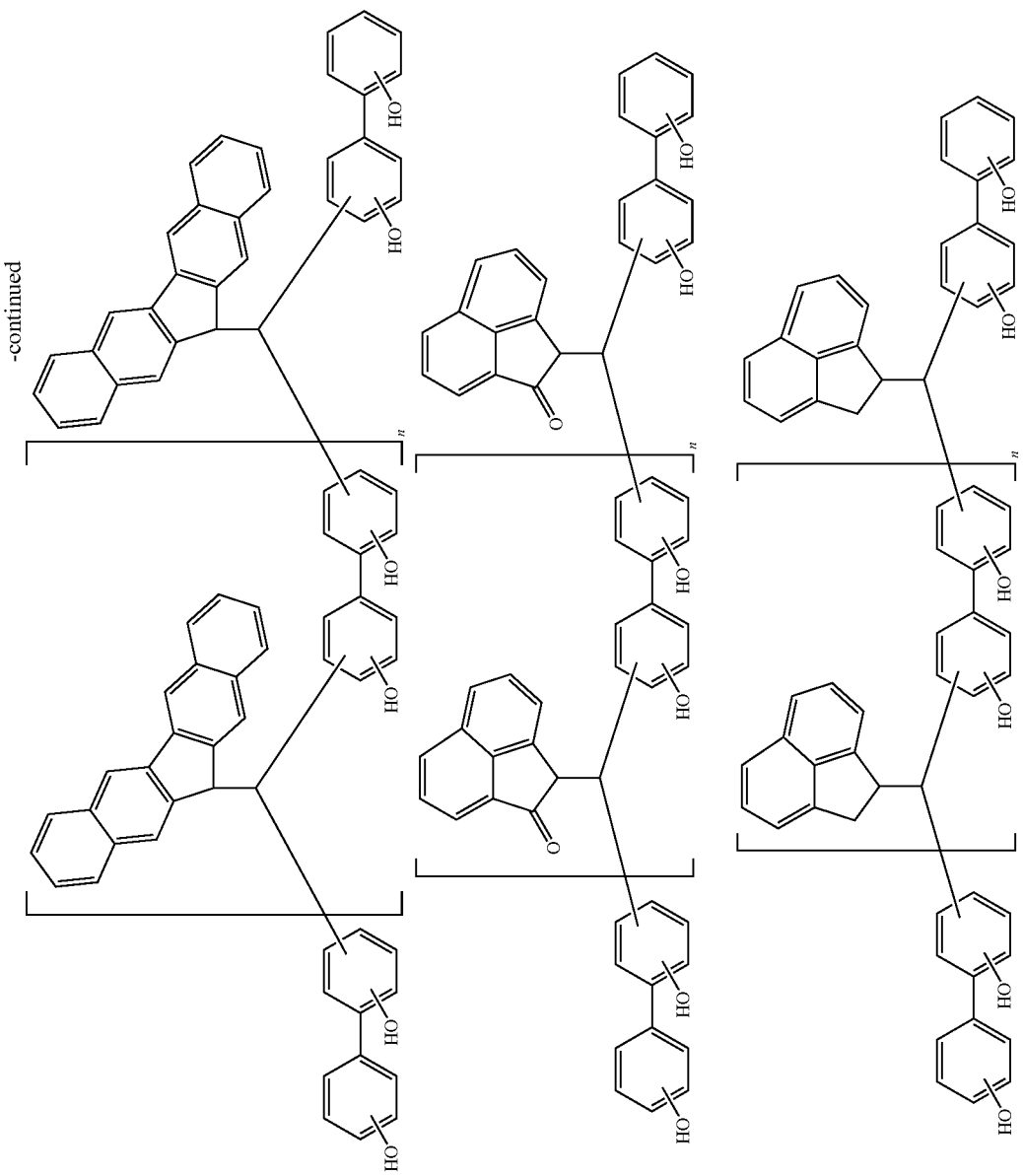

<Compound group Q>
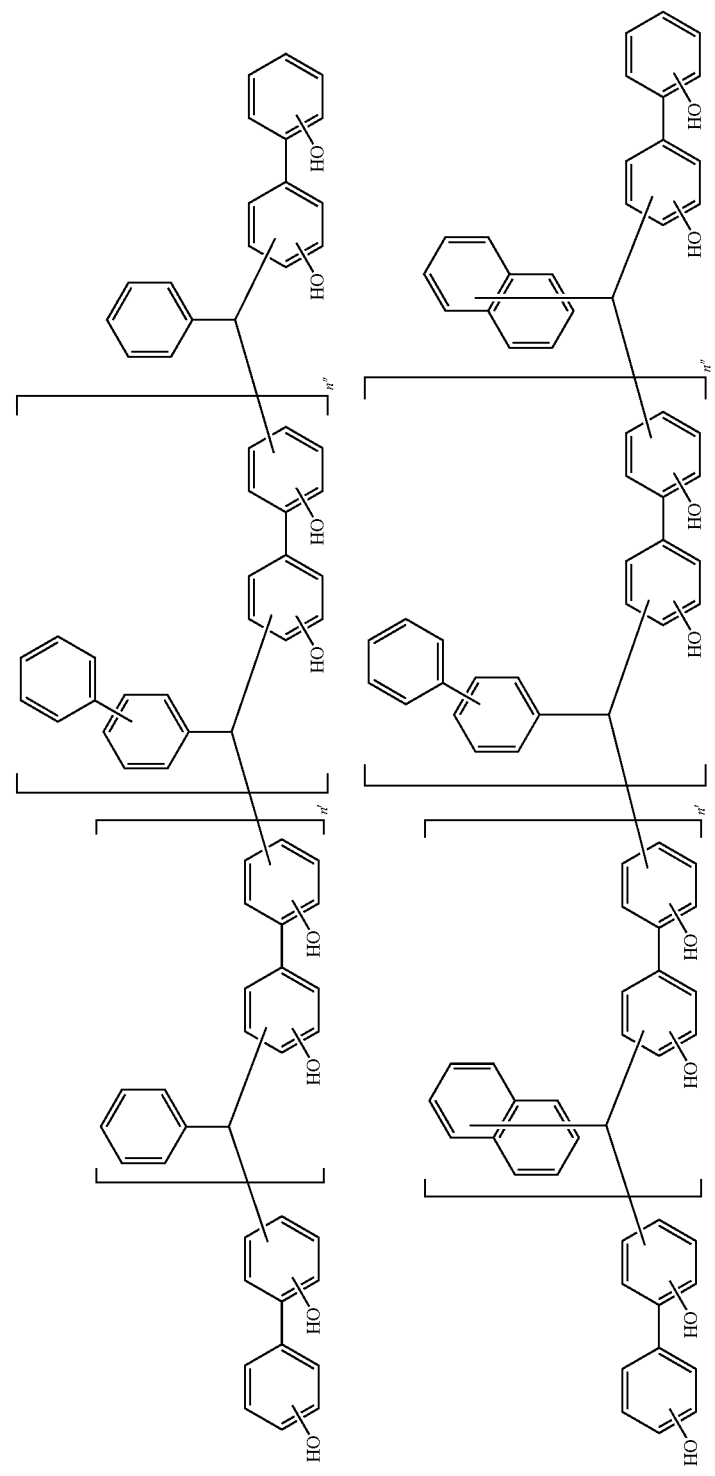
[F28]

In compound groups J to Q, n has the same meaning as defined in formula (1). n' is an integer of 0 to 3, and n" is an integer of 1 to 4. The sequence of the repeating units is arbitrarily set.

Notably, in the resist underlayer film forming composition of the present embodiment, these compounds (A) may be used singly or in combination of two or more species.

In the embodiment, compound (A) may be appropriately synthesized through a known technique. However, no particular limitation is imposed on the synthesis technique. In one procedure, a biphenol, a bithiophenol, a binaphthol, a bithionaphthol, or a bianthracenol is subjected to polycondensation reaction with a corresponding aldehyde or ketone in the presence of an acid catalyst, to thereby yield compound (A). If required, the polycondensation may be performed under pressurized conditions.

No particular limitation is imposed on the biphenol, and examples thereof include biphenol and methylbiphenol. These biphenols may be used singly or in combination of two or more species. Of these, biphenol is preferably used, from the viewpoint of consistent availability of raw material.

No particular limitation is imposed on the bithiophenol, and examples thereof include bithiophenol, methylbithiophenol, and methoxybithiophenol. These bithiophenols may be used singly or in combination of two or more species. Of these, bithiophenol is preferably used, from the viewpoint of consistent availability of raw material.

No particular limitation is imposed on the binaphthol, and examples thereof include binaphthol, methylbinaphthol, and methoxybinaphthol. These binaphthols may be used singly or in combination of two or more species. Of these, binaphthol is preferably used, from the viewpoints of elevation of carbon atom concentration and enhancement of heat resistance.

No particular limitation is imposed on the bithionaphthol, and examples thereof include bithionaphthol, methylbithionaphthol, and methoxybithionaphthol. These bithionaphthols may be used singly or in combination of two or more species. Of these, bithionaphthol is preferably used, from the viewpoints of elevation of carbon atom concentration and enhancement of heat resistance.

No particular limitation is imposed on the bianthracenol, and examples thereof include bianthracenol, methylbianthracenol, and methoxybianthracenol. These bianthracenols may be used singly or in combination of two or more species. Of these, bianthracenol is preferably used, from the viewpoints of elevation of carbon atom concentration and enhancement of heat resistance.

No particular limitation is imposed on the aldehyde. From the viewpoint of achieving high heat resistance, there is preferably used, for example, formaldehyde, trioxane, paraformaldehyde, acetaldehyde, propylaldehyde, butylaldehyde, hexylaldehyde, decylaldehyde, undecylaldehyde, phenylacetaldehyde, phenylpropylaldehyde, furfural, benzaldehyde, hydroxybenzaldehyde, fluorobenzaldehyde, chlorobenzaldehyde, nitrobenzaldehyde, methylbenzaldehyde, dimethylbenzaldehyde, ethylbenzaldehyde, propylbenzaldehyde, butylbenzaldehyde, cyclohexylbenzaldehyde, benzaldehyde, hydroxybenzaldehyde, fluorobenzaldehyde, chlorobenzaldehyde, nitrobenzaldehyde, methylbenzaldehyde, dimethylbenzaldehyde, ethylbenzaldehyde, propylbenzaldehyde, butylbenzaldehyde, cyclohexylbenzaldehyde, biphenylaldehyde, naphthaldehyde, anthracenecarboxaldehyde, phnenthrenecarboxaldehyde, pyrenecarboxaldehyde, glyoxal, glutalaldehyde, phthalaldehyde, napthalenedicarboxaldehyde, biphenyldicarboxaldehyde, anthracenedicarboxaldehyde, bis(diformylphenyl)methane, bis(diformylphenyl)propane, or benzenetricarboxaldehyde.

No particular limitation is imposed on the ketone, and examples thereof include acetone, methyl ethyl ketone, cyclobutanone, cyclopentanone, cyclohexanone, norbornanone, tricyclohexanone, tricyclodecanone, adamantanone, fluorenone, benzofluorenone, acenaphthenequinone, acenaphthenone, and anthraquinone. These ketones may be used singly or in combination of two or more species. Of these, from the viewpoint of achieving high heat resistance, there are preferably used, cyclopentanone, cyclohexanone, norbornanone, tricyclohexanone, tricyclodecanone, adamantanone, fluorenone, benzofluorenone, acenaphthenequinone, acenaphthenone, and anthraquinone.

No particular limitation is imposed on the acid catalyst employed in polycondensation reaction for the synthesis of compound (A), and may be appropriately selected from known acid catalysts. A wide range of inorganic acids and organic acids are known as such acid catalysts. No particular limitation is imposed on the acid catalyst, and examples thereof include inorganic acids such as hydrochloric acid, sulfuric acid, phosphoric acid, hydrobromic acid, and hydrofluoric acid; organic acids such as oxalic acid, malonic acid, succinic acid, adipic acid, sebacic acid, citric acid, fumaric acid, maleic acid, formic acid, p-toluenesulfonic acid, methanesulfonic acid, trifluoroacetic acid, dichloroacetic acid, trichloroacetic acid, trifluoromethanesulfonic acid, benzenesulfonic acid, napthalenesulfonic acid, and napthalenedisulfonic acid; Lewis acids such as zinc chloride, aluminum chloride, iron chloride, and boron trifluoride; and solid acids such as silicotungstic acid, phosphotungstic acid, silicomolybdic acid, and phosphomolybdic acid. Of these, organic acids and solid acids are preferred, from the viewpoint of production. Hydrochloric acid or sulfuric acid is more preferably used, from the viewpoints of availability, handling property, etc. in relation to the production thereof. These acid catalysts may be used singly or in combination of two or more species. No particular limitation is imposed on the amount of acid catalyst, and the amount may be appropriately set in accordance with the raw material and the type of the catalyst employed, reaction conditions, etc. The amount is preferably 0.01 parts by mass to 100 parts by mass, with respect to 100 parts by mass of reaction material.

In polycondensation reaction, a reaction solvent may be used. No particular limitation is imposed on the reaction solvent, so long as it allows to proceed the reaction of the employed aldehyde or ketone with the employed biphenol, bithiophenol, binaphthol, bithionaphthol, or bianthracenol. The solvent may be appropriately selected from known solvents. Examples of the solvent include water, methanol, ethanol, propanol, butanol, tetrahydrofuran, dioxane, ethylene glycol dimethyl ether, ethylene glycol diethyl ether, and a mixture thereof. These solvents may be used singly or in combination of two or more species.

No particular limitation is imposed on the amount of reaction solvent, and the amount may be appropriately set in accordance with the raw material and the type of the catalyst employed, reaction conditions, etc. The amount is preferably 0 part by mass to 2,000 parts by mass, with respect to 100 parts by mass of reaction material. Furthermore, no particular limitation is imposed on the reaction temperature of the polycondensation reaction, and the reaction temperature may be appropriately set in accordance with the reactivity of the reaction material. Generally, the reaction temperature is 10° C. to 200° C.

For yielding compound (A), the reaction temperature is preferably higher, specifically, 60° C. to 200° C. Notably, no particular limitation is imposed on the mode of reaction, and it may be appropriately selected from known techniques. In one reaction mode, a biphenol, a bithiophenol, a binaphthol, a bithionaphthol, or a bianthracenol, an aldehyde or a ketone, and a catalyst are fed together in a batch manner. In another reaction mode, a biphenol, a bithiophenol, a binaphthol, a bithionaphthol, or a bianthracenol, or an aldehyde or a ketone is added dropwise in the presence of a catalyst. After completion of polycondensation reaction, the formed compound may be isolated through a customary method. No particular limitation is imposed on the isolation method. In one generally employed procedure, the temperature of the reaction pot is elevated to 130° C. to 230° C. for removing unreacted material, a catalyst, etc. present in the reaction system, and volatile components are removed at about 1 mmHg to about 50 mmHg, to thereby yield compound (A) as a target compound.

The reaction is caused to proceed under preferred conditions. Specifically, 1 mol to an excess amount of a biphenol, a bithiophenol, a binaphthol, a bithionaphthol, or a bianthracenol, and 0.001 mol to 1 mol of an acid catalyst are used with respect to 1 mol of an aldehyde or a ketone, and the reaction is carried out at normal pressure and 50° C. to 150° C. for about 20 minutes to about 100 hours.

After completion of reaction, a target compound may be isolated through a known procedure. In one specific procedure, the reaction mixture is concentrated, and pure water is added to the concentrate, to thereby cause the reaction product to precipitate. The mixture is cooled to room temperature and filtered, to thereby isolate a solid. The solid is further filtered and dried. Subsequently, the target compound is isolated from by-products through column chromatography. The target compound is further subjected to distillation with solvent, filtration, and drying, to thereby yield compound (A) as the target product.

The cross-linkable compound (B) having a specific structure contained in the resist underlayer film forming composition is a compound represented by formula (2-1) or formula (2-2) (hereinafter referred to as "cross-linking agent (B)").

[F29]

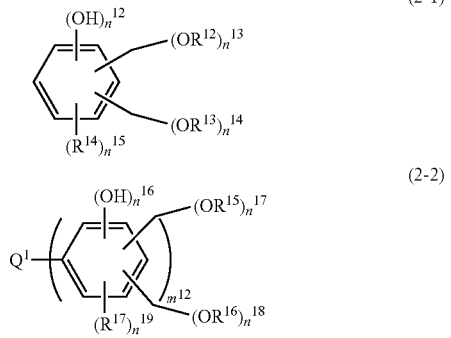

(2-1)

(2-2)

In formulas (2-1) and (2-2), $Q^1$ represents a single bond or an $m^{12}$-valent organic group; each of $R^{12}$ and $R^{15}$ independently represents a C2 to C10 alkyl group or a C2 to C10 alkyl group having a C1 to C10 alkoxy group; each of $R^{13}$ and $R^{16}$ represents a hydrogen atom or a methyl group; each of $R^{14}$ and $R^{17}$ represents a C1 to C10 alkyl group or a C6 to C40 aryl group; $n^{12}$ is an integer of 1 to 3; $n^{13}$ is an integer of 2 to 5; $n^{14}$ is an integer of 0 to 3; $n^{15}$ is an integer of 0 to 3, with these ns having a relationship of $3 \leq (n^{12}+n^{13}+n^{14}+n^{15}) \leq 6$; $n^{16}$ is an integer of 1 to 3; $n^{17}$ is an integer of 1 to 4; $n^{18}$ is an integer of 0 to 3; $n^{19}$ is an integer of 0 to 3, with these ns having a relationship of $2 \leq (n^{16}+n^{17}+n^{18}+n^{19}) \leq 5$; and $m^{12}$ is an integer of 2 to 10).

More specifically, $Q^1$ may be a single bond or an $m^{12}$-valent organic group which is selected from a C1 to C10 chain hydrocarbyl group, a C6 to C40 aromatic group, and a combination thereof. Examples of the chain hydrocarbyl group include the below-mentioned alkyl groups, and examples of the aromatic group include the below-mentioned aryl groups.

Examples of the C2 to C10 alkyl group include ethyl, n-propyl, i-propyl, cyclopropyl, n-butyl, i-butyl, s-butyl, t-butyl, cyclobutyl, 1-methylcyclopropyl, 2-methylcyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methylcyclobutyl, 2-methylcyclobutyl, 3-methylcyclobutyl, 1,2-dimethylcyclopropyl, 2,3-dimethylcyclopropyl, 1-ethylcyclopropyl, 2-ethylcyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyln-propyl, cyclohexyl, 1-methylcyclopentyl, 2-methylcyclopentyl, 3-methylcyclopentyl, 1-ethylcyclobutyl, 2-ethylcyclobutyl, 3-ethylcyclobutyl, 1,2-dimethylcyclobutyl, 1,3-dimethylcyclobutyl, 2,2-dimethylcyclobutyl, 2,3-dimethylcyclobutyl, 2,4-dimethylcyclobutyl, 3,3-dimethylcyclobutyl, 1-n-propylcyclopropyl, 2-n-propylcyclopropyl, 1-i-propylcyclopropyl, 2-i-propylcyclopropyl, 1,2,2-trimethylcyclopropyl, 1,2,3-trimethylcyclopropyl, 2,2,3-trimethylcyclopropyl, 1-ethyl-2-methylcyclopropyl, 2-ethyl-1-methylcyclopropyl, 2-ethyl-2-methylcyclopropyl, and 2-ethyl-3-methylcyclopropyl.

Examples of the C1 to C10 alkyl group include the aforementioned C2 to C10 alkyl groups and a methyl group.

Examples of the C1 to C10 alkoxy group include methoxy, ethoxy, n-propoxy, i-propoxy, n-butoxy, i-butoxy, s-butoxy, t-butoxy, n-pentoxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2,-trimethyl-n-propoxy, 1-ethyl-1-methyl-n-propoxy, and 1-ethyl-2-methyl-n-propoxy.

Examples of the C6 to C40 aryl group include phenyl, naphthyl, and anthryl.

Specific examples of the cross-linking agent (B) include, but are not limited to, the following compounds represented by formulas (3-1) to (3-40).

[F30]
(3-1)
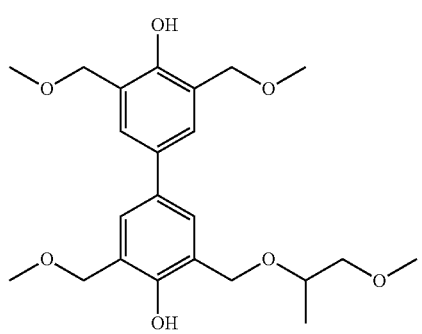
(3-2)
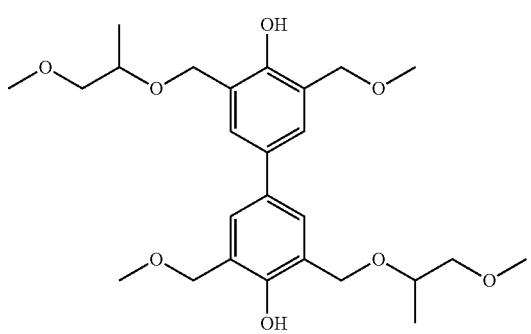
(3-3)
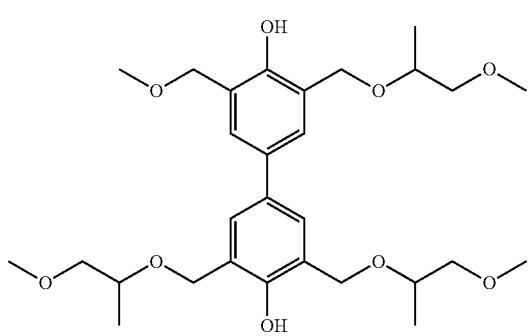
(3-4)
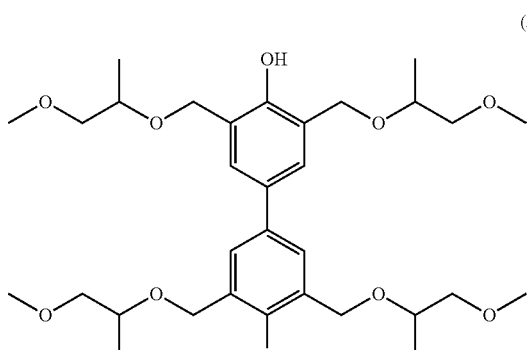
-continued
(3-5)
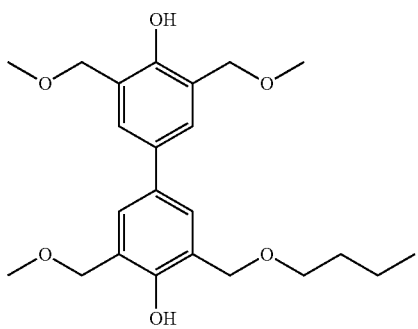
(3-6)
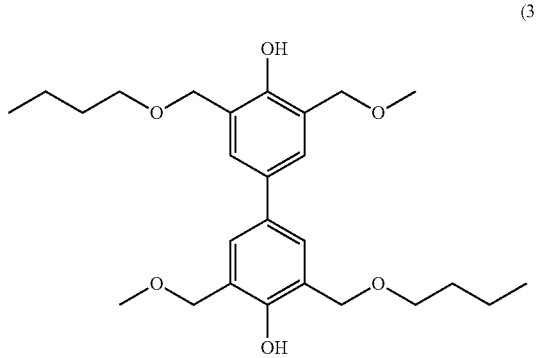
(3-7)
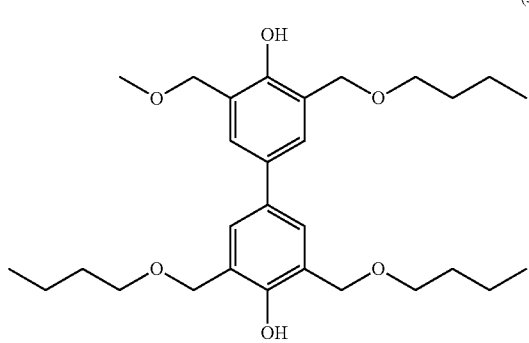
(3-8)
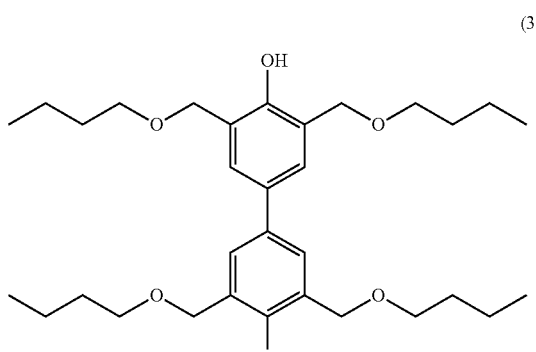

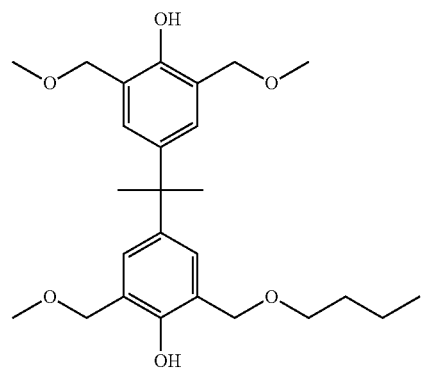
(3-9)
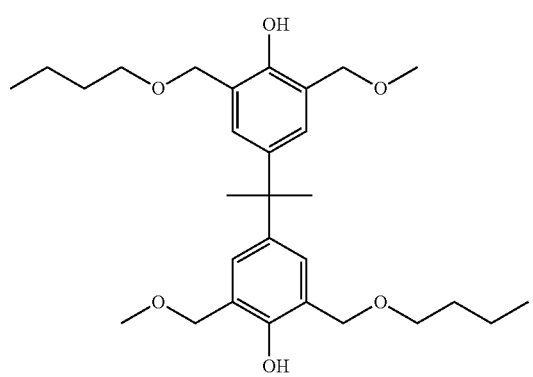
(3-10)
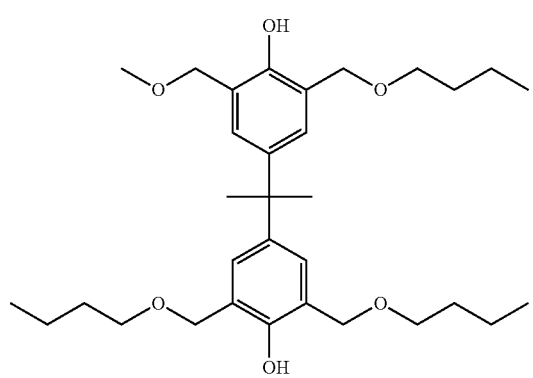
(3-11)
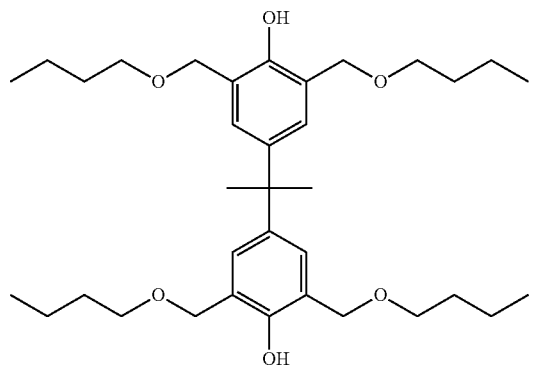
(3-12)
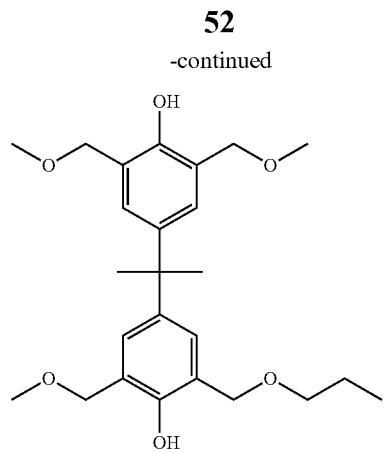
(3-13)
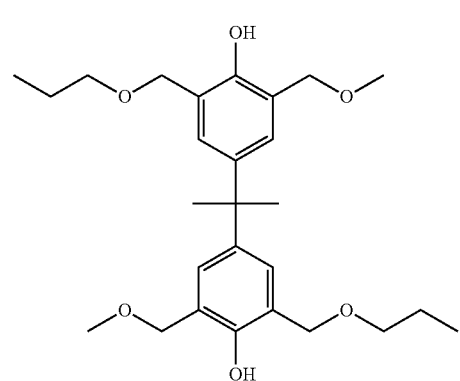
(3-14)
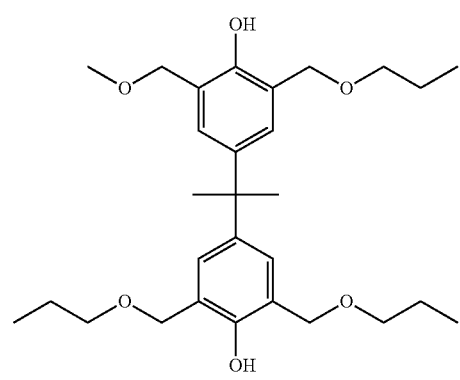
(3-15)
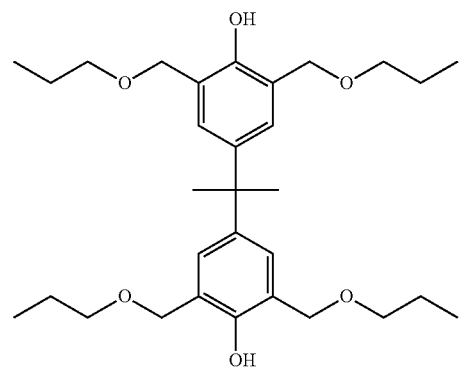
(3-16)

-continued
(3-17)
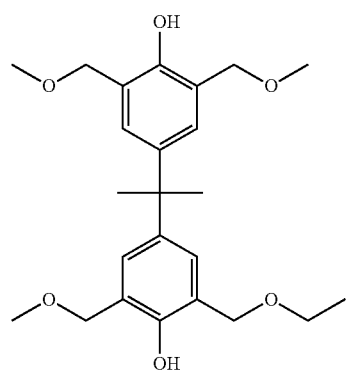
(3-18)
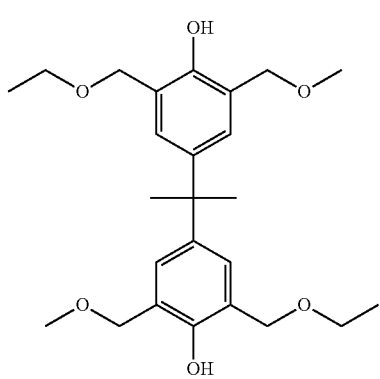
(3-19)
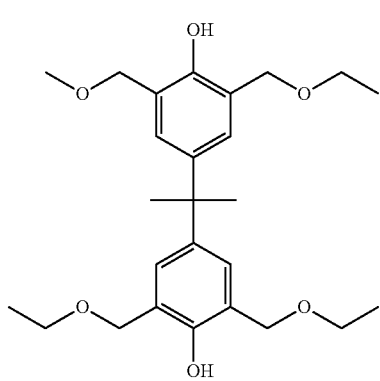
(3-20)
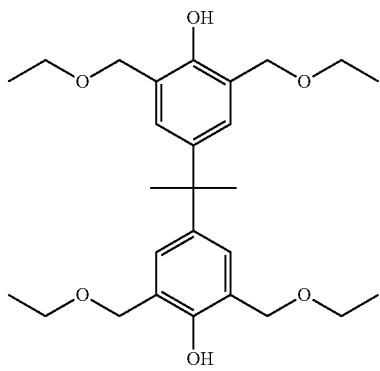
-continued
(3-21)
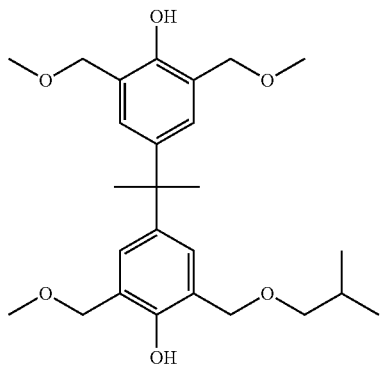
(3-22)
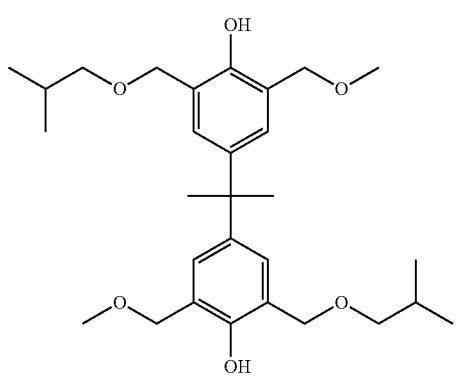
(3-23)
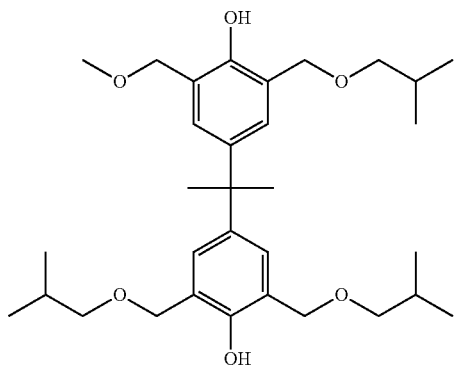
(3-24)
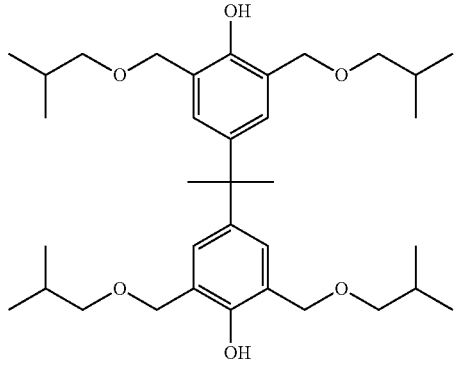

[F33]
(3-25)
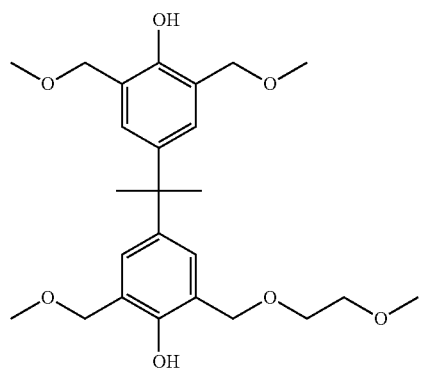
(3-29)
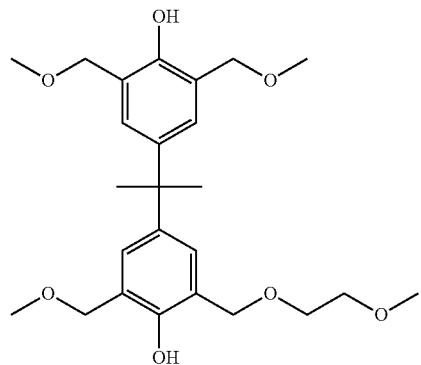
(3-26)
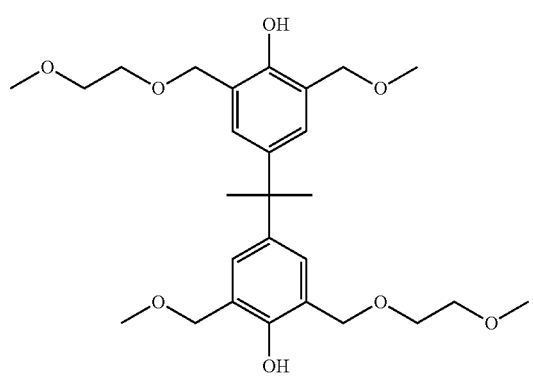
(3-30)
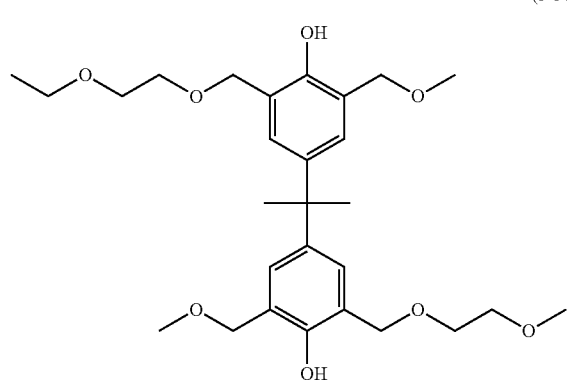
(3-27)
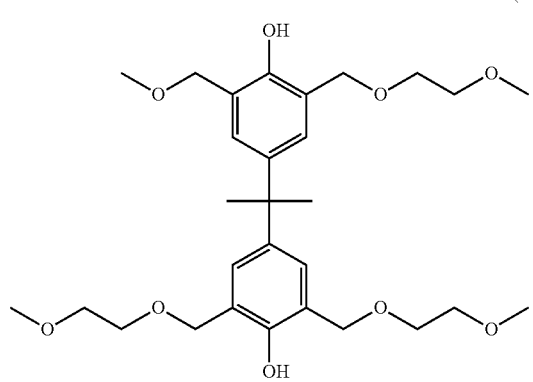
(3-31)
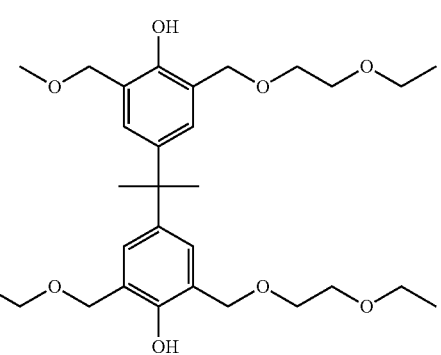
(3-28)
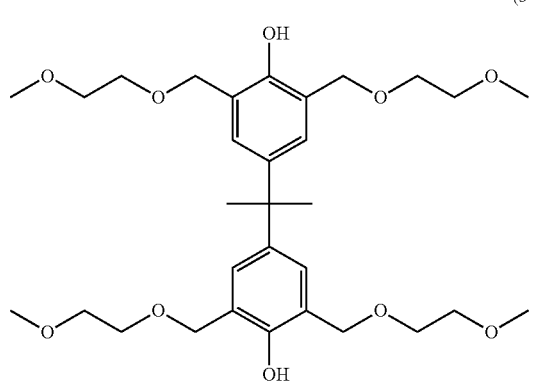
(3-32)
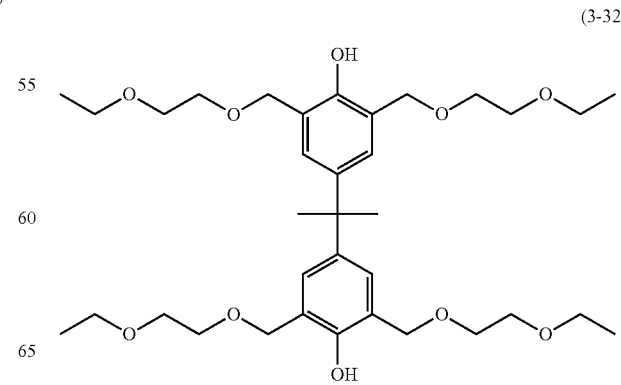

[F34]
(3-33)
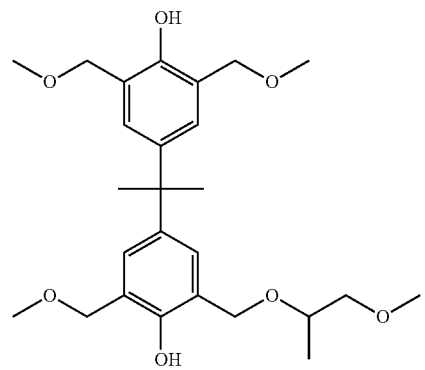
(3-34)
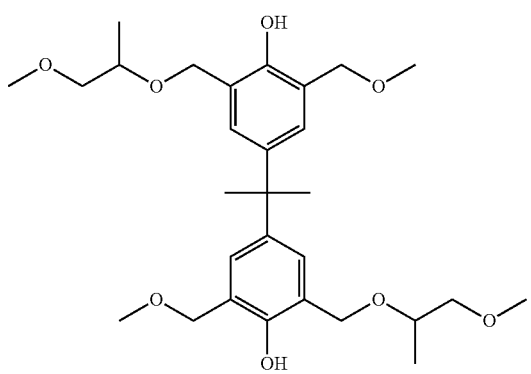
(3-35)
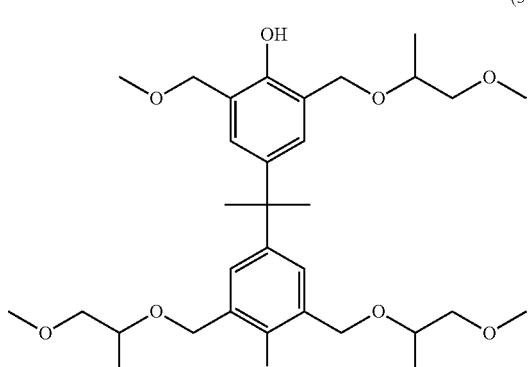
(3-36)
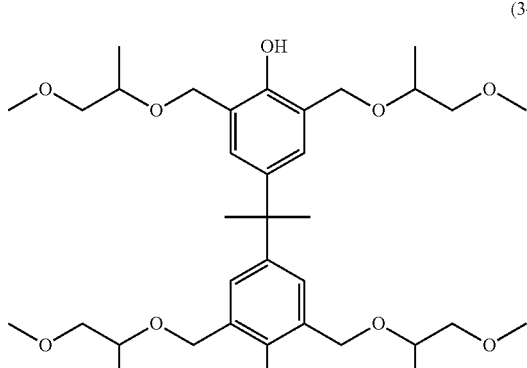
(3-37)
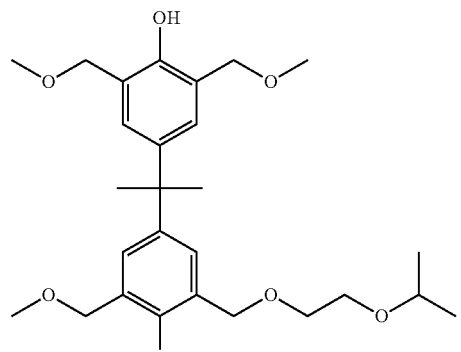
(3-38)
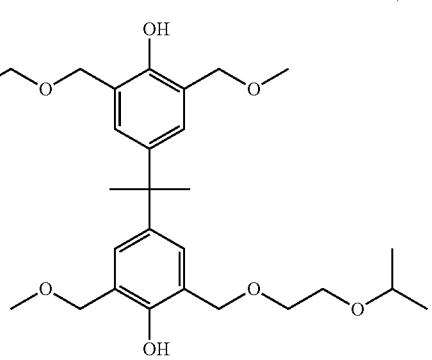
(3-39)
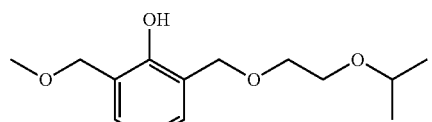
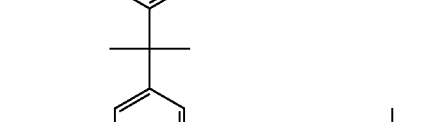
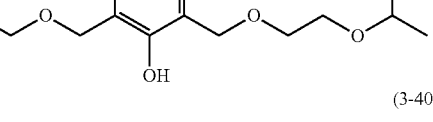
(3-40)
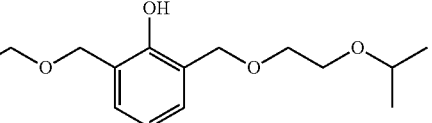
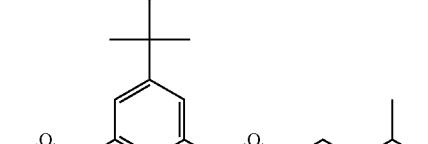
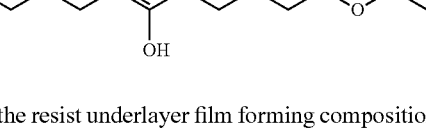
Notably, in the resist underlayer film forming composition of the present embodiment, these cross-linking agents (B) may be used singly or in combination of two or more species.
In the present embodiment, no particular limitation is imposed on the technique of synthesizing the cross-linking agent (B), and the compound may be appropriately synthesized through a known technique. In one procedure, the cross-linking agent (B) can be produced through reaction between a compound represented by formula (2'-1) or (2'-2) and an ether compound having a hydroxyl group or a C2 to C10 alcohol. Notably, a cross-linking agent (B) formed through substitution of 1 mol of a compound represented by formula (2'-1) or (2'-2) with 1 mol of an ether compound having a hydroxyl group or a C2 to C10 alcohol is referred to as a 1-substitution form. In a similar manner, cross-linking agents (B) formed through 2 mol substitution, 3 mol substitution, and 4 mol substitution are referred to as a 2-substitution form, 3-substitution form, and 4-substitution form, respectively.

[F35]

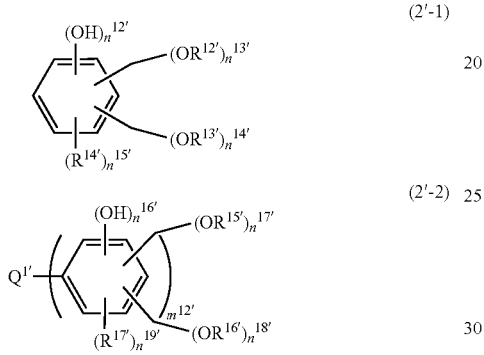

In the above formula (2'-1) or (2'-2), $Q^{1'}$ is a single bond or an $m^{12'}$-valent organic group. In other words, $Q^{1'}$ may be a single bond or an $m^{12'}$-valent organic group which is selected from a C1 to C10 chain hydrocarbyl group, a C6 to C40 aromatic group, and a combination thereof. Examples of the chain hydrocarbyl group include the aforementioned alkyl groups, and examples of the aromatic group include the aforementioned aryl groups.

Also, each of $R^{12'}$, $R^{13'}$, $R^{15'}$, and $R^{16'}$ represents a hydrogen atom or a methyl group; each of $R^{14'}$ and $R^{17'}$ represents a C1 to C10 alkyl group or a C6 to C40 aryl group; $n^{12'}$ is an integer of 1 to 3; $n^{13'}$ is an integer of 2 to 5; $n^{14'}$ is an integer of 0 to 3; $n^{15'}$ is an integer of 0 to 3, with these ns having a relationship of $3 \leq (n^{12'}+n^{13'}+n^{14'}+n^{15'}) \leq 6$; $n^{16'}$ is an integer of 1 to 3; $n^{17'}$ is an integer of 1 to 4; $n^{18'}$ is an integer of 0 to 3; $n^{19'}$ is an integer of 0 to 3, with these ns having a relationship of $2 \leq (n^{16'}+n^{17'}+n^{18'}+n^{19'}) \leq 5$; and $m^{12'}$ is an integer of 2 to 10).

Specific examples of the compound represented by formula (2'-1) or (2'-2) include, but are not limited to, the following compounds represented by formulas (4-1) to (4-27).

[F36]

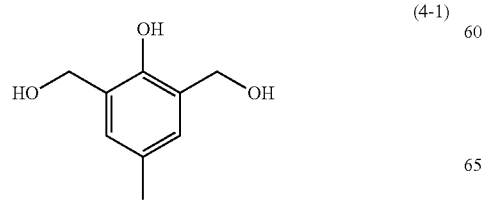
(4-1)

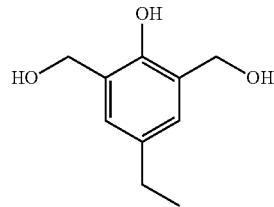
(4-2)

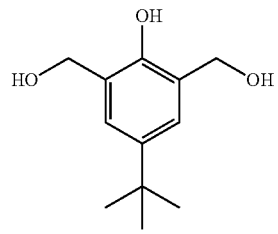
(4-3)

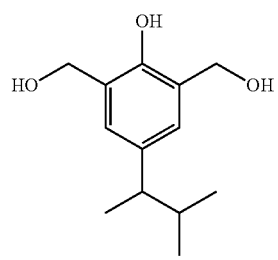
(4-4)

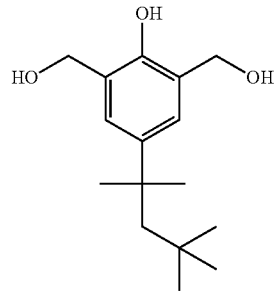
(4-5)

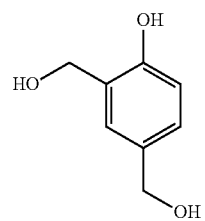
(4-6)

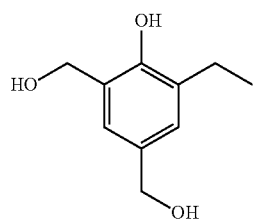
(4-7)

-continued
(4-8)
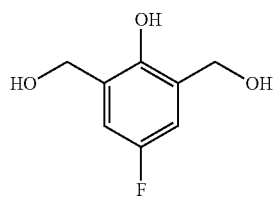
(4-9)
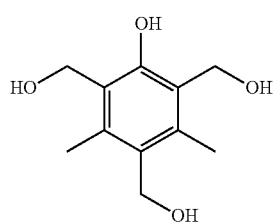
(4-10)
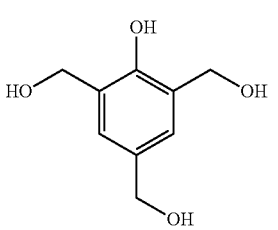
(4-11)
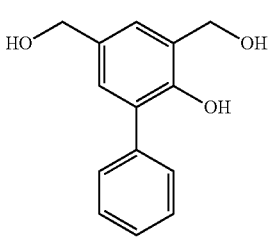
(4-12)
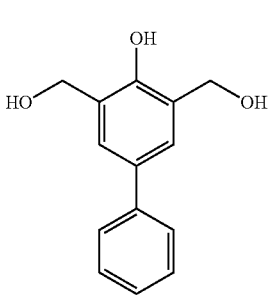
(4-13)
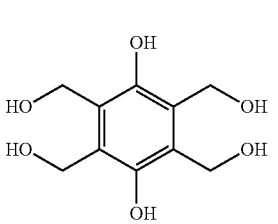
(4-14)
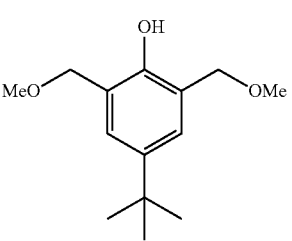
-continued
(4-15)
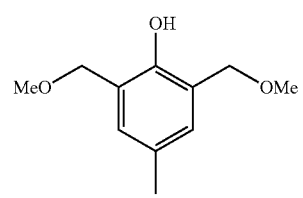
(4-16)
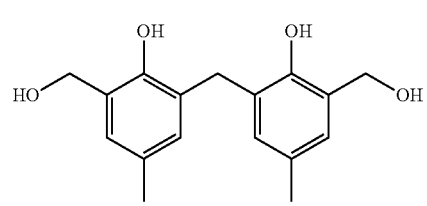
(4-17)
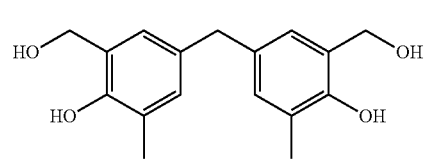
[F37]
(4-18)
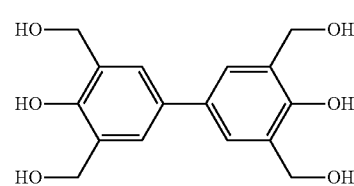
(4-19)
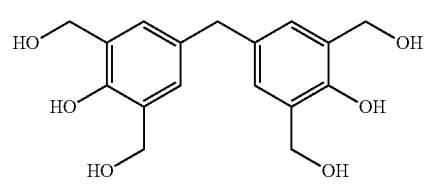
(4-20)
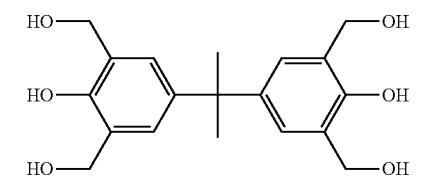
(4-21)
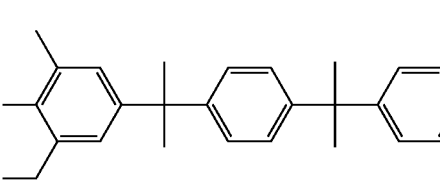
(4-22)
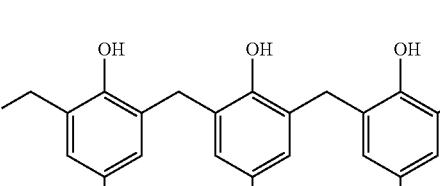

-continued

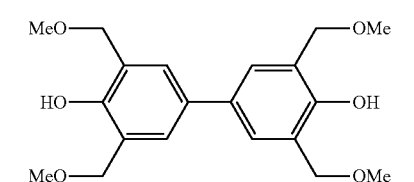
(4-23)

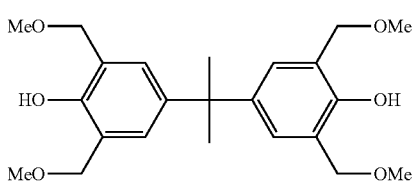
(4-24)

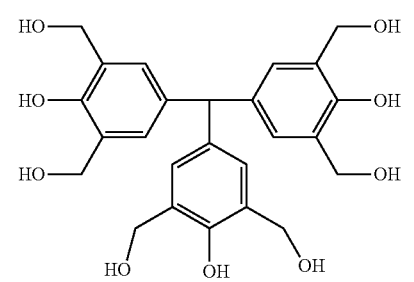
(4-25)

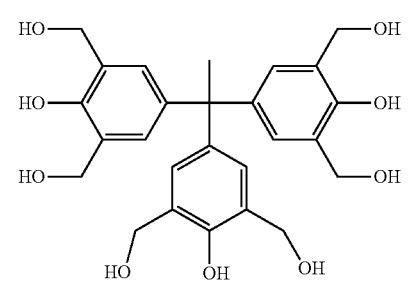
(4-26)

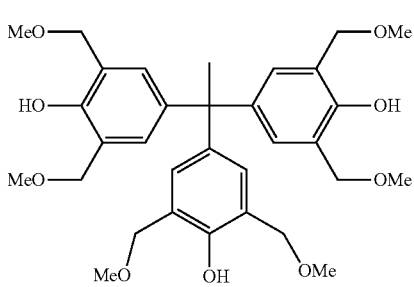
(4-27)

Specifically, the cross-linking agent (B) can be produced through reaction between the compound represented by formula (2'-1) or (2'-2) and an ether compound having a hydroxyl group or a C2 to C10 alcohol, in the presence of an acid catalyst.

No particular limitation is imposed on the acid catalyst employed, and it may be appropriately selected from known acid catalysts. Any of the aforementioned inorganic acids and organic acids may be used as the acid catalyst. For example, there may be used an acidic compound such as p-toluenesulfonic acid, trifluoromethanesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-napthalenesulfonic acid, citric acid, benzoic acid, hydroxybenzoic acid, or napthalenecarboxylic acid.

In order to leave no unreacted acid in the reaction system, an ion-exchange resin for catalyst may be used. For example, a strong acid-type (sulfonic acid-type) ion-exchange resin may be used as the ion-exchange resin for catalyst.

Examples of the ether compound having a hydroxyl group include propylene glycol monomethyl ether and propylene glycol monoethyl ether. Examples of the C2 to C10 alcohol include ethanol, 1-propanol, 2-methyl-1-propanol, butanol, 2-methoxyethanol, and 2-ethoxyethanol.

In addition to the aforementioned compound (A) and cross-linking agent (B), the resist underlayer film forming composition of the embodiment may further contain the below-mentioned solvent or a known additive, in accordance with need. The solid content of the resist underlayer film forming composition is 0.1 mass % to 70 mass %, preferably 0.1 mass % to 60 mass %. The solid content is a ratio of the amount of all composition ingredients except the solvent to the entire amount of the resist underlayer film forming composition. The solid component of the resist underlayer film forming composition contains compound (A) at a ratio of 1 mass % to 99.9 mass %, preferably 50 mass % to 99.9 mass %, particularly preferably 50 mass % to 95 mass %, most preferably 50 mass % to 90 mass %. Also, the solid component of the composition contains the cross-linking agent (B) at a ratio of 0.01 mass % to 50 mass %, preferably 0.01 mass % to 40 mass %, particularly preferably 0.1 mass % to 30 mass %.

Notably, the resist underlayer film forming composition may contain a cross-linking agent other than cross-linking agent (B), in accordance with need. Examples of the additional cross-linking agent include a melamine-type agent, a substituted urea-type agent, and a polymer thereof. The additional cross-linking agent is preferably a cross-linking agent having at least two cross-link-formable substituents; i.e., compounds such as methoxymethylate glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, butoxymethylated thiourea, etc. Also, a condensation product of these compounds may also be used.

Examples of the solvent of the resist underlayer film forming composition which solvent can dissolve ingredients of the composition include ethylene glycol monomethyl ether, ethylene glycol monoethylether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate.

These solvents may be used singly or in combination of two or more species. Alternatively, the solvent may be used with a high-boiling-point solvent such as propylene glycol monobutyl ether or propylene glycol monobutyl ether acetate. Among these solvents, from the viewpoint of safety, propylene glycol monomethyl ether, propylene glycol monomethyl ether acetate, ethyl lactate, butyl lactate, cyclohexanone, etc. are preferably used singly or in combination of two or more species.

The resist underlayer film forming composition may further contain a known additive such as a cross-linking catalyst, a surfactant, a light-absorbing agent, a rheology modifier, or an adhesive aid.

Examples of the cross-linking catalyst (E) for accelerating the aforementioned cross-linking reaction of compound (A) with the cross-linking agent (B) include acid compounds such as p-toluenesulfonic acid, trifluoromethanesulfonic acid, salicylic acid, 5-sulfosalicylic acid (5-SSA), pyridinium p-phenolsulfonate (PyPSA), pyridinium p-toluenesulfonate (PyPTS), pyridinium trifluoromethanesulfonate (PyTFMS), pyridinium p-phenolsulfonate (PyPSA), pyridinium p-toluenesulfonate (PyPTS), 4-phenolsulfonic acid, camphorsulfonic acid, 4-chlorobenzenesulfonic acid, benzenedisulfonic acid, 1-napthalenesulfonic acid, citric acid, benzoic acid, hydroxybenzoic acid, and napthalenecarboxylic acid; thermal acid-generators such as 2,4,4,6-tetrabromocyclohexadienone, benzoin tosylate, 2-nitrobenzyl tosylate, and alkyl esters of other organic sulfonic acids; onium-type photoacid-generators such as bis(4-t-butylphenyl)iodonium trifluoromethanesulfonate and triphenylsulfonium trifluoromethanesulfonate; halogen-containing compound-based photoacid-generators such as phenylbis(trichloromethyl)-s-triazine; and sulfonic acid-based photoacid-generators such as benzoin tosylate, N-hydroxysuccinimide trifluoromethanesulfonate, and di-tert-butyldiphenyliodonium nanofluoromethanesulfonate (e.g., DTDPI, product of Midori Kagaku Co., Ltd.). These cross-linking catalysts may be used singly or in combination of two or more species. Among these cross-linking catalysts, di-tert-butyldiphenyliodonium nanofluoromethanesulfonate (e.g., DTDPI, product of Midori Kagaku Co., Ltd.), 5-sulfosalicylic acid (5-SSA), pyridinium p-phenolsulfonate (PyPSA), pyridinium p-toluenesulfonate (PyPTS), pyridinium trifluoromethanesulfonate (PyTPMS), and trifluoromethanesulfonic acid partially or totally blocked with a quaternary element (e.g., K-PURE TAG-2689 (product of King Industries)) are preferably used. The cross-linking catalyst content with respect to the total solid content is 0.0001 mass % to 20 mass %, preferably 0.0005 mass % to 10 mass %, more preferably 0.01 mass % to 3 mass %.

The resist underlayer film forming composition may further contain a surfactant, in order to prevent generation of pinholes, striation, or the like and further enhance coatability to prevent surface coating failure. Examples of the surfactant include polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; polyoxyethylene sorbitan fatty acid ester nonionic surfactants such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluosurfactants such as EF-Top EF301, EF303, and EF352 (products of Tochem Product), Megaface F171, F173, and R-30 (products of DIC Corporation), Fluorad FC430, and FC431 (product of Sumitomo 3M), Asahi-Guard AG710, Surflon S-382, SC101, SC102, SC103, SC104, SC105, and SC106 (product of AGC); and organosiloxane polymer KP341 (product of Shin-Etsu Chemical Co., Ltd.). These surfactants may be used singly or in combination of two or more species. The surfactant content of the resist underlayer film forming composition is generally ≤2.0 mass % with respect to the total solid content, preferably ≤1.0 mass %.

The light-absorbing agent employed in the resist underlayer film forming composition is, for example, such commercial agents as disclosed in "Technology and Market of Industrial Dye" (CMC Publishing Co., Ltd) and "Handbook of Dyes" (The Society of Synthetic Organic Chemistry, Japan). Specific examples include C.I. Disperse Yellow 1, 3, 4, 5, 7, 8, 13, 23, 31, 49, 50, 51, 54, 60, 64, 66, 68, 79, 82, 88, 90, 93, 102, 114, and 124; C.I. Disperse Orange 1, 5, 13, 25, 29, 30, 31, 44, 57, 72, and 73; C.I. Disperse Red 1, 5, 7, 13, 17, 19, 43, 50, 54, 58, 65, 72, 73, 88, 117, 137, 143, 199, and 210; C.I. Disperse Violet 43; C.I. Disperse Blue 96; C.I. Fluorescent Brightening Agent 112, 135, and 163; C.I. Solvent Orange 2 and 45; C.I. Solvent Red 1, 3, 8, 23, 24, 25, 27, and 49; C.I. Pigment Green 10; and C.I. Pigment Brown 2. The amount of light-absorbing agent is generally 10 mass %, preferably 5 mass %, with respect to the total solid content of the resist underlayer film forming composition.

The rheology modifier is added mainly for enhancing the flowability of the resist underlayer film forming composition and particularly for enhancing uniformity in thickness of the resist underlayer film in a baking step and chargeability of the resist underlayer film forming composition into holes. Specific examples include phthalic acid derivatives such as dimethyl phthalate, diethyl phthalate, diisobutyl phthalate, and dihexyl phthalate, butyl isodecyl phthalate; adipic acid derivatives such as di-n-butyl adipate, diisobutyl adipate, diisooctyl adipate, and octyl decyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate. The amount of rheology modifier is generally <30 mass %, with respect to the total solid content of the resist underlayer film forming composition.

The adhesive aid is added mainly for enhancing adhesion between the substrate or the resist and the resist underlayer film forming composition and particularly for preventing removal of the resist in development. Specific examples include chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, dimethyltrimethylsilylamine, and trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; ureas such as 1,1-dimethylurea and 1,3-dimethylurea; and thiourea compounds. The amount of adhesive aid is generally <5 mass %, preferably <2 mass %, with respect to the total solid content of the resist underlayer film forming composition.

The resist underlayer film forming composition of the present embodiment may contain another cross-linkable compound (hereinafter referred to as "cross-linking agent (C)") instead of the cross-linking agent (B), and the below-mentioned cross-linking catalyst (D) as a cross-linking catalyst.

Examples of the cross-linking agent (C) contained in the resist underlayer film forming composition include a melamine compound, a guanamine compound, a glycoluril compound, a urea compound, an epoxy compound, a thioepoxy compound, an isocyanate compound, an azide compound, and a compound having a double bond (e.g., an alkenyl ether group) and at least one substituent (i.e., cross-linkable group) selected from a methylol group, an alkoxymethyl group, and an acyloxymethyl group. These cross-linking agents (C) may be used singly or in combination of two or more species.

Specific examples of the aforementioned melamine compound include, but are not limited to, compounds derived through methoxymethylation of 1 to 6 methylol groups of hexamethylolmelamine, hexamethoxymethylmelamine, or hexamethylolmelamine, and a mixture thereof; and compounds derived through acryloxymethylation of 1 to 6 methylol groups of hexamethoxyethylmelamine, hexaacyloxymethylmelamine, or hexamethylolmelamine, and a mixture thereof. Specific examples of the epoxy compound include tris(2,3-epoxypropyl) isocyanurate, trimethylolmethane triglycidyl ether, trimethylolpropane triglycidyl ether, and triethylolethane triglycidyl ether.

Specific examples of the aforementioned guanamine compound include, but are not limited to, compounds derived through methoxymethylation of 1 to 4 methylol groups of tetramethylolguanamine, or tetramethoxymethylguanamine, tetramethylolguanamine, and a mixture thereof; and compounds derived through acyloxymethylation of 1 to 4 methylol groups of tetramethoxyethylguanamine, tetraacyloxyguanamine, or tetramethylolguanamine, and a mixture thereof. Specific examples of the glycoluril compound include, but are not limited to, compounds derived through methoxymethylation of 1 to 4 methylol groups of tetramethylolglycoluril, tetramethoxyglycoluril, tetramethoxymethylglycoluril, or tetramethylolglycoluril, and a mixture thereof; compounds derived through acyloxymethylation of 1 to 4 methylol groups of tetramethylolglycoluril, and a mixture thereof. Specific examples of the urea compound include, but are not limited to, compounds derived through methoxymethylation of 1 to 4 methylol groups of tetramethylolurea, tetramethoxymethylurea, or tetramethylolurea, and a mixture thereof; and tetramethoxyethylurea.

Specific examples of the compound having an alkenyl ether group include, but are not limited to, ethylene glycol divinyl ether, triethylene glycol divinyl ether, 1,2-propanediol divinyl ether, 1,4-butanediol divinyl ether, tetramethyleneglycol divinyl ether, neopentylglycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylolpropane trivinyl ether.

Among them, glycoluril compounds are preferred. More specifically, preferred are compounds derived through methoxymethylation of 1 to 4 methylol groups of tetramethylolglycoluril, tetramethoxyglycoluril, tetramethoxymethylglycoluril, or tetramethylolglycoluril, and a mixture thereof; and compounds derived through acyloxymethylation of 1 to 4 methylol groups of tetramethylolglycoluril, and a mixture thereof. Of these, tetramethoxymethylglycoluril is more preferred.

Examples of the cross-linking catalyst (D) contained in the resist underlayer film forming composition include p-toluenesulfonic acid, trifluoromethanesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-napthalenesulfonic acid, pyridinium trifluoromethanesulfonate, pyridinium p-phenolsulfonate, citric acid, benzoic acid, hydroxybenzoic acid, napthalenecarboxylic acid, 2,4,4,6-tetrabromocyclohexadienone, benozin tosylate, 2-nitrobenzyl tosylate, pyridinium p-phenolsulfonate, pyridinium p-toluenesulfonate, pyridinium trifluoromethanesulfonate, trifluoromethanesulfonic acid partially or totally blocked with a quaternary element, hexafluoroantimonic acid partially or totally blocked with a quaternary element, dodecylbenzenesulfonic acid partially or totally blocked with an amine, and an aromatic sulfonium hexafluorophosphate, and an aromatic sulfonium hexafluoroantimonate.

Examples of the quaternary element include a quaternary ammonium cation.

Among them, preferred are 5-sulfosalicylic acid, pyridinium trifluoromethanesulfonate, pyridinium p-phenolsulfonate, trifluoromethanesulfonic acid, pyridinium p-toluenesulfonate, trifluoromethanesulfonic acid partially or totally blocked with a quaternary element, hexafluoroantimonic acid partially or totally blocked with a quaternary element, dodecylbenzenesulfonic acid partially or totally blocked with an amine, and an aromatic sulfonium hexafluorophosphate, and an aromatic sulfonium hexafluoroantimonate. From the viewpoint of excellent heat resistance, preferred are 5-sulfosalicylic acid (5-SSA), pyridinium p-phenolsulfonate (PyPSA), pyridinium p-toluenesulfonate (PyPTS), pyridinium trifluoromethanesulfonate (PyTFMS), and trifluoromethanesulfonic acid partially or totally blocked with a quaternary element (e.g., K-PURE TAG-2689 (product of King Industries).

Specific examples of the hexafluoroantimonic acid partially or totally blocked with a quaternary element include K-PURE (registered trademark; CXC-1612 and CXC-1733). Specific examples of the trifluoromethanesulfonic acid partially or totally blocked with a quaternary element include K-PURE (registered trademark; CXC-1614, TAG-2678, and TAG-2689). Specific examples of the dodecylbenzenesulfonic acid partially or totally blocked with an amine include K-PURE TAG-2172 and TAG-2179 (products of King Industries). Specific examples of the aromatic sulfonium hexafluoroantimonate include SI-45, SI-60, SI-80, SI-100, and SI-150 (products of Sanshin Chemical Industry Co., Ltd.). Specific examples of the aromatic sulfonium hexafluorophosphate include SI-110 (product of Sanshin Chemical Industry Co., Ltd.).

These cross-linking catalysts (D) may be used singly or in combination of two or more species.

Since the resist underlayer film forming composition of the present embodiment is formed from compound (A) having a unique specific structure, the composition allows application of a wet process in formation of a photoresist underlayer film and has excellent heat resistance and etching resistance, and also exhibits high solubility in solvent. Therefore, through use of the compound, an underlayer film having excellent etching resistance (e.g., oxygen plasma etching resistance) can be formed, and deterioration of the film during high-temperature baking can be suppressed. Furthermore, the composition provides excellent adhesion with a resist layer, whereby a favorable resist pattern can be formed.

Since the resist underlayer film forming composition of the present embodiment is formed from the cross-linking agent (B) having a unique specific structure, a light-absorbing moiety is present in the skeleton thereof. In consideration of the effect as an anti-reflection film, substantially no substance diffuses to the resist during heating/drying, and the light-absorbing moiety maintains sufficiently high light absorbing performance. Thus, high reflection light preventing effect can be attained. In addition, since the composition has high thermal stability, contamination of the upper layer by a decomposition product generated in baking can be prevented, and the baking temperature range can be considerably widened. Under controlled process conditions, the formed film can be used with exhibiting, in addition to light-reflection preventing performance, a function of preventing interaction between a substrate and a resist, and a function of preventing an adverse effect on a substrate caused by a substance generated during exposure to the resist or a material of the resist.

Even when the resist underlayer film forming composition contains the cross-linking agent (C) instead of the cross-linking agent (B), the effect of compound (A) having a specific structure can be attained. In other words, the composition can be applied to a wet process for forming a resist underlayer film. Since the composition has excellent heat resistance and etching resistance, deterioration of the film during high-temperature baking is suppressed, and the formed underlayer film can exhibit excellent etching resistance to oxygen plasma etching or the like. Furthermore, the formed excellent resist pattern exhibits high adhesion with the resist layer.

(Resist Underlayer Film)

The resist employed in the present embodiment is a photoresist or an electron-beam resist.

The resist underlayer film of the present embodiment is used in a lithographic technique of a semiconductor production process. The photoresist applied to the upper surface of the resist underlayer film may be a negative type or a positive type. Examples of the photoresist include a positive-type photoresist formed from a novolak resin and 1,2-naphthoquinonediazide sulfonate; a chemical amplification photoresist formed of a photo-acid generator and a binder having a group which is decomposed by acid to elevate alkali dissolution rate; a chemical amplification photoresist formed of an alkali-soluble binder, a low-molecular weight compound which is decomposed by acid to elevate alkali dissolution rate, and a photo-acid generator; a chemical amplification photoresist formed of a binder having a group which is decomposed by acid to elevate alkali dissolution rate, a low-molecular weight compound which is decomposed by acid to elevate alkali dissolution rate, and a photo-acid generator; and a photoresist containing silicon (Si) atoms in its skeleton. Examples of commercial photoresists include APEX-E (product of Rohm & Haas).

Examples of the electron-beam resist applied onto the upper surface of the resist underlayer film include a composition containing a resin having an Si—Si bond in its backbone and an aromatic ring in its end, and an acid-generator which generates acid through irradiation with an electron beam; and a composition containing poly(p-hydroxystyrene) whose hydroxyl groups are substituted by an organic group having N-carboxamine, and an acid-generator which generates acid through irradiation with an electron beam. In the latter electron-beam resist composition, the acid generated through irradiation of the acid-generator with an electron beam reacts with side-chain N-carboxyaminoxy groups of the polymer, whereby the polymer side chain groups are decomposed to form hydroxyl groups, which are alkali-soluble. As a result, the polymer can be dissolved in an alkali developer, to thereby form a resist pattern.

Examples of the acid-generator which generates acid through irradiation with an electron beam include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine; onium salts such as a triphenylsulfonium salt and a diphenyliodonium salt; and sulfonic acid esters such as nitrobenzyl tosylate and dinitrobenzyl tosylate.

The employable developer for developing a resist underlayer film formed from the resist underlayer film forming composition may be an aqueous solution of an alkali, and examples of the alkali include inorganic alkalis including sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcoholamines such as dimethylethanolamine and triethanolamine; quaternary ammonium salts such as tetramethylammonium hydroxide, tetraethylammonium hydroxide, and choline; and cyclic amines such as pyrrole and piperidine. The aqueous alkali solution may further contain an appropriate amount of alcohol (e.g., isopropyl alcohol) or a surfactant (e.g., a nonionic surfactant), to thereby provide a developer. Among these developers, a quaternary ammonium salt is preferred, with tetramethylammonium hydroxide and choline being more preferred.

(Resist Pattern Formation Method)

Next, the resist pattern formation method of the present embodiment will be described. Onto a substrate (e.g., silicon-on-$SiO_2$ or a transparent substrate such as a glass substrate or an ITO substrate) for use in production of precision integrated circuit elements, a resist underlayer film forming composition is applied through an appropriate coating method such as spinner coating or coater coating, to thereby form a coating film. The film is baked for curing to form a resist underlayer film (a baked product). The thickness of the resist underlayer film is preferably 0.01 μm to 3.0 μm. Baking after coating is performed at 80° C. to 350° C. for 0.5 minutes to 120 minutes.

Subsequently, a resist is directly applied onto the resist underlayer film. Alternatively, if required, one layer to several layers of the resist underlayer film forming composition are formed on the first resist underlayer film, and then a resist is applied thereonto. The resist is irradiated with light or an electron beam through a mask of a predetermined pattern, followed by developing, rinsing, and drying, whereby a satisfactory resist pattern can be obtained. If required, after irradiation with light or an electron beam, additional heating (post exposure baking) (PEB) may be performed. The portion of the resist underlayer film where the resist has been removed through development is removed through dry etching, whereby a pattern of interest can be formed on the substrate.

The exposure light to which the resist is exposed is a chemical ray such as a near-UV ray, a far-UV ray, or an extreme UV (e.g., EUV, wavelength: 13.5 nm). Specifically, light having a wavelength of 248 nm (KrF laser beam), 193 nm (ArF laser beam), 157 nm (F2 laser beam), etc. may be employed. No particular limitation is imposed on the mode of light irradiation, so long as an acid can be generated from the photo-acid generator. The exposure dose is preferably 1 mJ/$cm^2$ to 2,000 mJ/$cm^2$, more preferably 10 mJ/$cm^2$ to 1,500 mJ/$cm^2$, particularly preferably 50 mJ/$cm^2$ to 1,000 mJ/$cm^2$. Also, irradiation of the electron-beam resist may be performed by means of, for example, an electron-beam irradiator.

(Semiconductor Device Production Method)

In the present embodiment, a semiconductor device can be produced through the following steps: a step of forming a resist underlayer film from a resist underlayer film forming composition of the embodiment; a step of forming a resist film on the resist underlayer film; a step of forming a resist pattern through exposure to light or an electron beam and development; a step of etching the resist underlayer film by the mediation of the resist pattern; and a step of processing the semiconductor substrate through the patterned resist underlayer film.

In future demand for a finer resist pattern, failure to attain high resolution and collapse of the resist pattern after development will be problematic. Thus, a thinner resist film will be desired. However, difficulty is encountered in attaining such a film thickness of the resist pattern so as to perform satisfactory substrate processing. There is thus required a process which provides a resist underlayer film provided between the resist and the semiconductor substrate to be processed, in addition to the resist pattern, with a function of a mask during processing of the substrate. Differing from a conventional resist underlayer film having a high etching rate, such a process requires the following resist underlayer films: a resist underlayer film having a selectivity in dry etching rate similar to that of a corresponding resist; a resist underlayer film having a selectivity in dry etching rate smaller than that of a corresponding resist; and a resist underlayer film having a selectivity in dry etching rate smaller than that of a relevant semiconductor substrate. In addition, such a resist underlayer film can be provided with a refection-preventing function. As a result, the resist underlayer film can also serve as a reflection-preventing film, which has conventionally been employed.

Meanwhile, in order to yield a fine resist pattern, there has been employed a process in which the width of a resist pattern and a resist underlayer film during dry etching of the resist underlayer film is reduced to be smaller than the pattern width during development of the resist. The resist underlayer film employed in such a process is required to have a selectivity in dry etching rate similar to that of the resist, which differs from the case of a conventional reflection-preventing film having high etching rate. In addition, such a resist underlayer film can be provided with a refection-preventing function. As a result, the resist underlayer film can also serve as a reflection-preventing film, which has conventionally been employed.

In the present embodiment, a resist underlayer film of the embodiment is formed on a substrate, and, on the resist underlayer film, a resist can be directly formed. Alternatively, if required, one layer to several layers of the resist underlayer film forming composition are formed on the first resist underlayer film, and then a resist is applied thereonto. As a result, a narrow resist pattern is formed. Even in the case where a thin resist layer is applied so as to prevent collapse of the pattern, the substrate can be processed through selecting an appropriate etching gas.

More specifically, a semiconductor device can be produced through the following steps: a step of forming a resist underlayer film on a semiconductor substrate from a resist underlayer film forming composition; a step of forming, on the resist underlayer film, a hard mask through application of a coating material (inorganic material) containing a silicon component or the like (e.g., forming a hard mask through spin coating of a composition for forming a silicon-containing resist underlayer film (inorganic resist underlayer film) (see, for example, WO 2009/104552 A1)), or through vapor deposition (e.g., forming a film of an inorganic material (e.g., silicon oxynitride) through CVD); a step of forming a resist film on the hard mask; a step of forming a resist pattern through irradiation with light or an electron beam and development; a step of etching the hard mask with a halogen-containing gas via the thus-formed resist pattern; a step of etching the resist underlayer film with an oxygen-containing gas or a hydrogen-containing gas via the patterned hard mask; and a step of processing the semiconductor substrate with a halogen-containing gas via the patterned resist underlayer film.

EXAMPLES

The present invention will next be described in more detail by way of the following Examples, which should not be construed as limiting the invention thereto.

Example 1

A resin for the resist underlayer film forming composition (NEOFARIT 7177C-30A, which is a mixture of n=0 (61%), n=1 (25%), n=2 (9%), and n=4 (5%) as determined through GPC (standard reference material: polystyrene) (3.33 g) as compound (A) represented by formula (5); 3,3',5,5'-tetramethoxymethyl-4,4'-bisphenol (TMOM-BP, product of Honshu Chemical Industry Co., Ltd.) (0.10 g) as the cross-linking agent (B) represented by formula (4-23); di-tert-butyldiphenyliodonium nanofluoromethanesulfonate (DTDPI, product of Midori Kagaku Co., Ltd.) (0.01 g) as a cross-linking catalyst; and a fluosurfactant (Megaface R-30N, product of DIC) (0.001 g) as a surfactant were dissolved in propylene glycol monomethyl ether (6.67 g) and propylene glycol monomethyl ether acetate (15.55 g), to thereby prepare a resist underlayer film forming composition.

[F38]

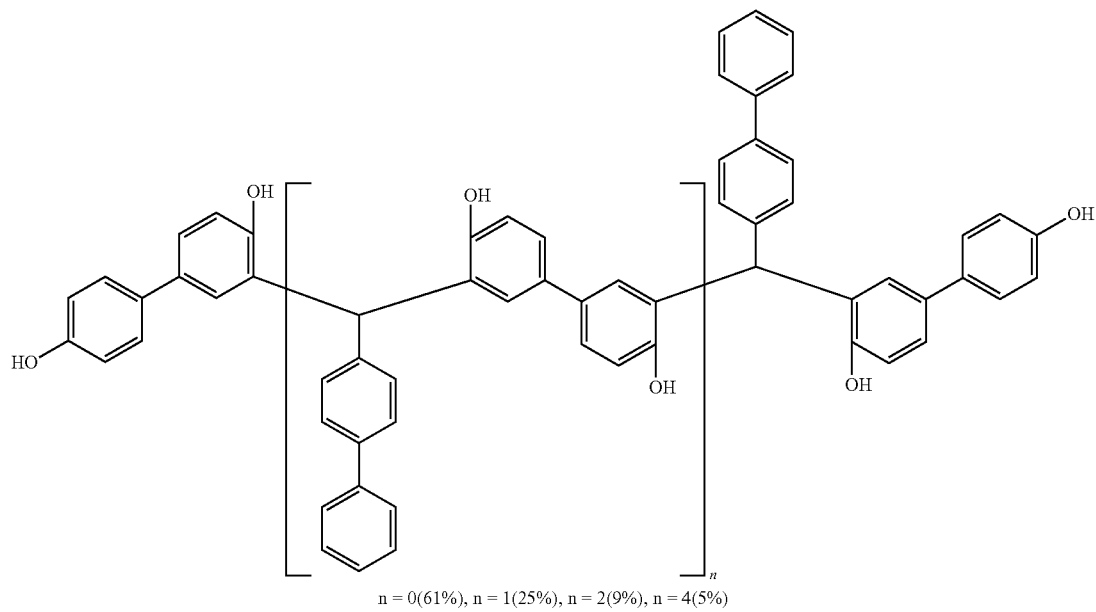

(5)

n = 0(61%), n = 1(25%), n = 2(9%), n = 4(5%)

[F39]

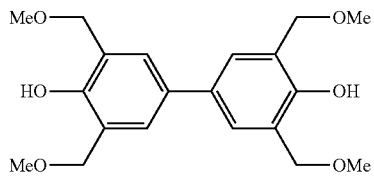

Example 2

A resin for the resist underlayer film forming composition (NEOFARIT 7177C-30A) (3.33 g) as compound (A) represented by formula (5); PGME-BIP-A (product of Finechem) (0.10 g) as the cross-linking agent (B); di-tert-butyldiphenyliodonium nanofluoromethanesulfonate (DTDPI, product of Midori Kagaku Co., Ltd.) (0.01 g) as a cross-linking catalyst; and a fluosurfactant (Megaface R-30N, product of DIC) (0.001 g) as a surfactant were dissolved in propylene glycol monomethyl ether (6.67 g) and propylene glycol monomethyl ether acetate (15.55 g), to thereby prepare a resist underlayer film forming composition. Notably, PGME-BIP-A used as the cross-linking agent (B) is a mixture mainly containing a compound represented by formula (3-36) with a compound represented by formula (3-33), a compound represented by formula (3-34), and a compound represented by formula (3-35).

[F40]

(3-33)

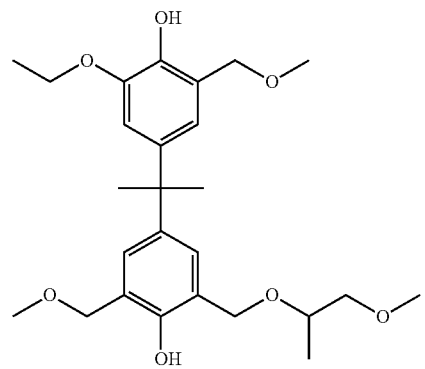

(3-34)

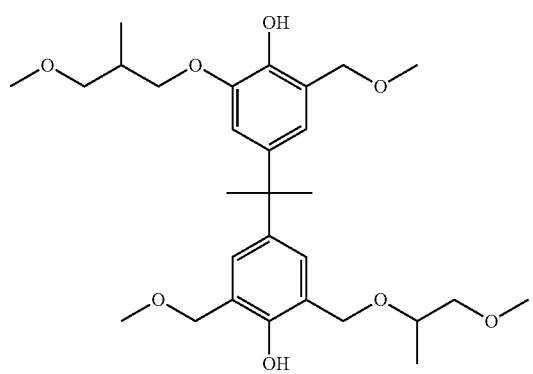

(4-23)

(3-35)

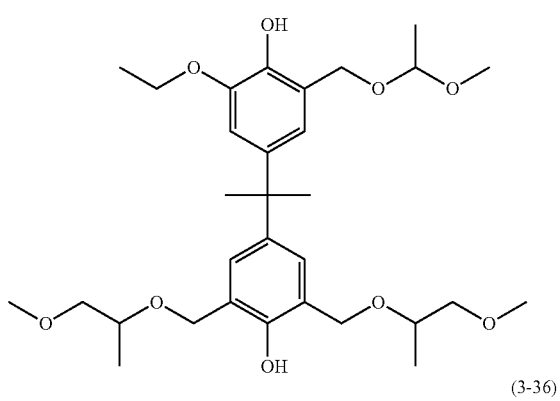

(3-36)

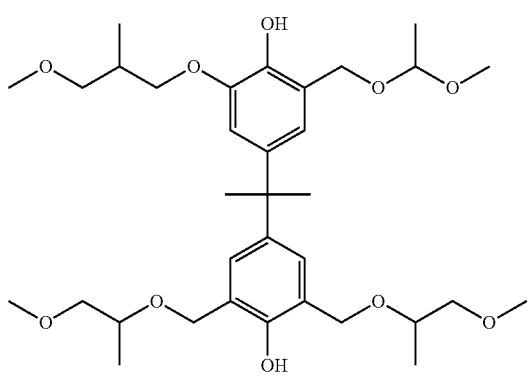

Example 3

A resin for the resist underlayer film forming composition (NEOFARIT 7177C-30A) (3.33 g) as compound (A) represented by formula (5); 3,3',5,5'-tetramethoxymethyl-4,4'-bisphenol (TMOM-BP, product of Honshu Chemical Industry Co., Ltd.) (0.10 g) as the cross-linking agent (B); 5-sulfosalicylic acid (0.01 g) as a cross-linking catalyst; and a fluosurfactant (Megaface R-30N, product of DIC) (0.001 g) as a surfactant were dissolved in propylene glycol monomethyl ether (6.67 g) and propylene glycol monomethyl ether acetate (15.55 g), to thereby prepare a resist underlayer film forming composition.

Example 4

A resin for the resist underlayer film forming composition (NEOFARIT 7177C-30A) (3.33 g) as compound (A) represented by formula (5); 3,3',5,5'-tetramethoxymethyl-4,4'-bisphenol (TMOM-BP, product of Honshu Chemical Industry Co., Ltd.) (0.10 g) as the cross-linking agent (B);

pyridinium trifluoromethanesulfonate (0.01 g) as a cross-linking catalyst; and a fluosurfactant (Megaface R-30N, product of DIC) (0.001 g) as a surfactant were dissolved in propylene glycol monomethyl ether (6.67 g) and propylene glycol monomethyl ether acetate (15.55 g), to thereby prepare a resist underlayer film forming composition.

Example 5

A resin for the resist underlayer film forming composition (NEOFARIT 7177C-30A) (3.33 g) as compound (A) represented by formula (5); 3,3',5,5'-tetramethoxymethyl-4,4'-bisphenol (TMOM-BP, product of Honshu Chemical Industry Co., Ltd.) (0.10 g) as the cross-linking agent (B); pyridinium p-phenolsulfonate (0.01 g) as a cross-linking catalyst; and a fluosurfactant (Megaface R-30N, product of DIC) (0.001 g) as a surfactant were dissolved in propylene glycol monomethyl ether (6.67 g) and propylene glycol monomethyl ether acetate (15.55 g), to thereby prepare a resist underlayer film forming composition.

Example 6

A resin for the resist underlayer film forming composition (NEOFARIT 7177C-30A) (3.33 g) as compound (A) represented by formula (5); 3,3',5,5'-tetramethoxymethyl-4,4'-bisphenol (TMOM-BP, product of Honshu Chemical Industry Co., Ltd.) (0.10 g) as the cross-linking agent (B); trifluoromethanesulfonic acid partially or totally blocked with a quaternary element (K-PURE TAG-2689, product of King Industries) (0.01 g) as a cross-linking catalyst; and a fluosurfactant (Megaface R-30N, product of DIC) (0.001 g) as a surfactant were dissolved in propylene glycol monomethyl ether (6.67 g) and propylene glycol monomethyl ether acetate (15.55 g), to thereby prepare a resist underlayer film forming composition.

Example 7

A resin for the resist underlayer film forming composition (NEOFARIT 7177C-30A) (3.33 g) as compound (A) represented by formula (5); 1,3,4,6-tetrakis(methoxymethyl)glycoluryl (Nikalac MX-270, product of Sanwa Chemical Co., Ltd.) (0.10 g) as the cross-linking agent (C) having a skeleton of a urea compound represented by formula (6); 5-sulfosalicylic acid (0.01 g) as a cross-linking catalyst (D); and a fluosurfactant (Megaface R-30N, product of DIC) (0.001 g) as a surfactant were dissolved in propylene glycol monomethyl ether (6.67 g) and propylene glycol monomethyl ether acetate (15.55 g), to thereby prepare a resist underlayer film forming composition.

[F41]

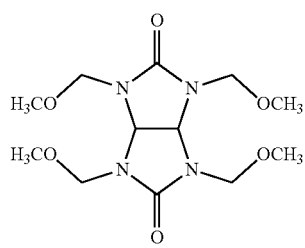

(6)

Example 8

A resin for the resist underlayer film forming composition (NEOFARIT 7177C-30A) (3.33 g) as compound (A) represented by formula (5); 1,3,4,6-tetrakis(methoxymethyl)glycoluryl (Nikalac MX-270, product of Sanwa Chemical Co., Ltd.) (0.10 g) as the cross-linking agent (C) having a skeleton of a urea compound represented by formula (6); pyridinium trifluoromethanesulfonate (0.01 g) as a cross-linking catalyst (D); and a fluosurfactant (Megaface R-30N, product of DIC) (0.001 g) as a surfactant were dissolved in propylene glycol monomethyl ether (6.67 g) and propylene glycol monomethyl ether acetate (15.55 g), to thereby prepare a resist underlayer film forming composition.

Example 9

A resin for the resist underlayer film forming composition (NEOFARIT 7177C-30A) (3.33 g) as compound (A) represented by formula (5); 1,3,4,6-tetrakis(methoxymethyl)glycoluryl (Nikalac MX-270, product of Sanwa Chemical Co., Ltd.) (0.10 g) as the cross-linking agent (C) having a skeleton of a urea compound represented by formula (6); pyridinium p-phenolsulfonate (0.01 g) as a cross-linking catalyst (D); and a fluosurfactant (Megaface R-30N, product of DIC) (0.001 g) as a surfactant were dissolved in propylene glycol monomethyl ether (6.67 g) and propylene glycol monomethyl ether acetate (15.55 g), to thereby prepare a resist underlayer film forming composition.

[F42]

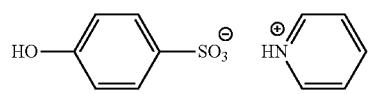

(7)

Example 10

A resin for the resist underlayer film forming composition (NEOFARIT 7177C-30A) (3.33 g) as compound (A) represented by formula (5); 1,3,4,6-tetrakis(methoxymethyl)glycoluryl (Nikalac MX-270, product of Sanwa Chemical Co., Ltd.) (0.10 g) as the cross-linking agent (C) having a skeleton of a urea compound represented by formula (6); trifluoromethanesulfonic acid partially or totally blocked with a quaternary element (K-PURE TAG-2689, product of King Industries) (0.01 g) as a cross-linking catalyst (D); and a fluosurfactant (Megaface R-30N, product of DIC) (0.001 g) as a surfactant were dissolved in propylene glycol monomethyl ether (6.67 g) and propylene glycol monomethyl ether acetate (15.55 g), to thereby prepare a resist underlayer film forming composition.

Comparative Example 1

A resin for the resist underlayer film forming composition (NEOFARIT 7177C-30A) (3.33 g) as compound (A) represented by formula (5); 1,3,4,6-tetrakis(methoxymethyl)glycoluryl (Nikalac MX-270, product of Sanwa Chemical Co., Ltd.) (0.10 g) as the cross-linking agent (C) having a skeleton of a urea compound represented by formula (6); di-tert-butyldiphenyliodonium nanofluoromethanesulfonate (DTDPI, product of Midori Kagaku Co., Ltd.) (0.01 g) as a cross-linking catalyst; and a fluosurfactant (Megaface R-30N, product of DIC) (0.001 g) as a surfactant were dissolved in propylene glycol monomethyl ether (6.67 g) and propylene glycol monomethyl ether acetate (15.55 g), to thereby prepare a resist underlayer film forming composition.

(Measurement of Sublimation Matter Amount)

The amount of sublimation matter was determined by means of a sublimation matter amount measurement apparatus, which is disclosed in WO 2007/111147 (pamphlet). Firstly, each of the resist underlayer film forming compositions produced in Examples 1 to 10, and Comparative Example 1 was applied onto a silicon wafer substrate (diameter: 4 inches) by means of a spin coater so as to adjust the film thickness to 50 nm. The wafer coated with the resist underlayer film was placed in the aforementioned sublimation matter amount measurement apparatus integrated with a hot plate, and baked for 120 seconds. The sublimation matter was collected by a quartz crystal microbalance (QCM) sensor (i.e., a quartz oscillator equipped with an electrode). In the QCM sensor, when sublimation matter is deposited on the surface of the quartz oscillator (i.e., electrode), the frequency of the quartz oscillator changes (decreases) in response to the increase in mass. As a result, a minute change in mass can be determined.

The specific measurement procedure is as follows. The hot plate of the sublimation matter amount measurement apparatus was heated to a measurement temperature as shown in Table 1. The pump flow rate was adjusted to 1 $m^3/s$, and the state was maintained for initial 60 seconds so as to stabilize the apparatus. Immediately thereafter, a wafer coated with the resist underlayer film was rapidly mounted on the hot plate through a slide inlet. The sublimation matter was collected from time 60 seconds to time 180 seconds (for a duration of 120 seconds). Notably, during the measurement, no nozzle was attached to a flow attachment (i.e., a detection member) which connects the QCM sensor and a collection funnel member of the sublimation matter amount measurement apparatus. Thus, the flow through a flow path (diameter: 32 mm) of a chamber unit which is disposed 30 mm apart from the sensor (i.e., a quartz oscillator) was not limited. Also, the electrode of the QCM sensor was formed of a material (AlSi) mainly containing silicon and aluminum. The diameter of the quartz oscillator (i.e., the sensor), the diameter of the surface electrode of the quartz oscillator, and the oscillation frequency were 14 mm, 5 mm, and 9 MHz, respectively.

The thus-obtained change in frequency was reduced to the corresponding mass (g) by means of the specific frequency of the quartz oscillator, to thereby elucidate the relation between the sublimation matter amount of one wafer coated with the resist underlayer film, and the baking temperature. Meanwhile, the apparatus was allowed to stand (with no wafer) during the initial period (time 0 to time 60 seconds) so as to stabilize the apparatus. The wafer was set on a hot plate at time 60 seconds, and the sublimation matter amount of the wafer was measured during a period of time 60 seconds to time 180 seconds. Table 1 below shows the sublimation matter amount of the resist underlayer film as determined by means of the apparatus as a relative sublimation matter amount. The relative sublimation matter amount is a value normalized with respect to the sublimation matter amount from the resist underlayer film of Comparative Example 1, as 1.00.

TABLE 1

| Resist underlayer film | Baking temp. (° C.) | Relative sublimation matter amount |
|---|---|---|
| Ex. 1 | 300 | 0.70 |
| Ex. 2 | 300 | 0.80 |
| Ex. 3 | 300 | 0.76 |
| Ex. 4 | 300 | 0.62 |
| Ex. 5 | 300 | 0.96 |
| Ex. 6 | 300 | 0.67 |
| Ex. 7 | 300 | 0.83 |
| Ex. 8 | 300 | 0.89 |
| Ex. 9 | 300 | 0.75 |
| Ex. 10 | 300 | 0.88 |
| Comp. Ex. 1 | 300 | 1.00 |

SUMMARY

The results are summarized. The relative sublimation matter amounts of the resist underlayer film compositions prepared in Examples 1 to 10 were smaller than the relative sublimation matter amount of the resist underlayer film composition prepared in Comparative Example 1. That is, the cross-linking agents and the cross-linking catalysts employed in Examples 1 to 10 can effectively suppress the amount of generated sublimation matter.

INDUSTRIAL APPLICABILITY

The present invention provides a resist underlayer film forming composition which has excellent coatability and which forms a resist underlayer film having excellent etching resistance, heat resistance, and other properties. Thus, the present invention is industrially advantageous.

The invention claimed is:
1. A resist underlayer film forming composition comprising a compound (A) represented by formula (1):

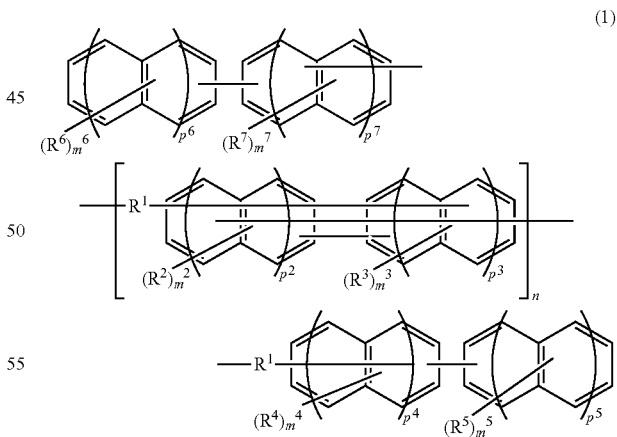

wherein, independently, $R^1$ represents a C1 to C30 alkylene group which may have a linear hydrocarbyl group, a branched hydrocarbyl group or a C6 to C30 aromatic group; each of $R^2$ to $R^7$ represents a C1 to C10 linear, branched, or cyclic alkyl group, a C6 to C10 aryl group, a C2 to C10 alkenyl group, a thiol group, or a hydroxyl group; at least one $R^5$ is a hydroxyl group or a thiol group; each of $m^2$, $m^3$, and $m^6$ is an integer of 0 to 9; each of $m^4$ and $m^7$ is an integer of 0 to 8; $m^5$ is an integer of 1 to 9; n is an integer of 0 to 4; and each of $p^2$ to $p^7$ is an integer of 0 to 2, and
a cross-linkable compound;
(B) represented by formula (2-1) or (2-2):

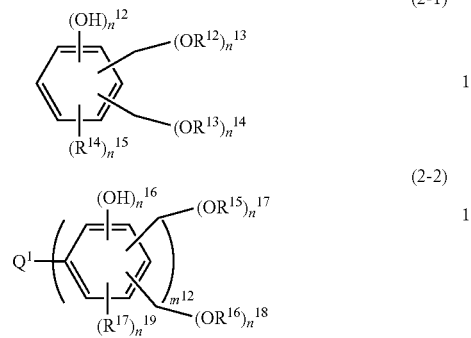

wherein $Q^1$ represents a single bond or an $m^{12}$-valent organic group; each of $R^{12}$ and $R^{15}$ independently represents a C2 to C10 alkyl group or a C2 to C10 alkyl group having a C1 to C10 alkoxy group; each of $R^{13}$ and $R^{16}$ represents a hydrogen atom or a methyl group; each of $R^{14}$ and $R^{17}$ represents a C1 to C10 alkyl group or a C6 to C40 aryl group; $n^{12}$ is an integer of 1 to 3; $n^{13}$ is an integer of 2 to 5; $n^{14}$ is an integer of 0 to 3; $n^{15}$ is an integer of 0 to 3, with these ns having a relationship of $3 \leq (n^{12}+n^{13}+n^{14}+n^{15}) \leq 6$; $n^{16}$ is an integer of 1 to 3; $n^{17}$ is an integer of 1 to 4; $n^{18}$ is an integer of 0 to 3; $n^{19}$ is an integer of 0 to 3, with these ns having a relationship of $2 \leq (n^{16}+n^{17}+n^{18}+n^{19}) \leq 5$ and $m^{12}$ is an integer of 2 to 10.

2. The resist underlayer film forming composition according to claim 1, which further comprises a cross-linking catalyst (E).

3. A resist underlayer film forming composition comprising a compound (A) represented by formula (1):

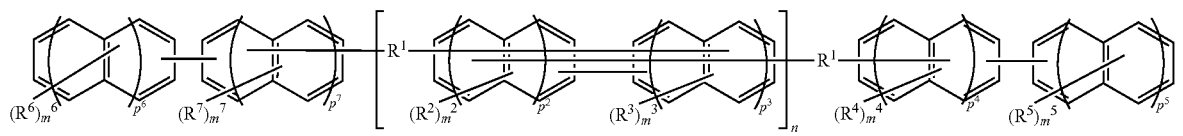

wherein, independently, $R^1$ represents a C1 to C30 alkylene group which may have a linear hydrocarbyl group, a branched hydrocarbyl group or a C6 to C30 aromatic group; each of $R^2$ to $R^7$ represents a C1 to C10 linear, branched, or cyclic alkyl group, a C6 to C10 aryl group, a C2 to C10 alkenyl group, a thiol group, or a hydroxyl group; at least one $R^5$ is a hydroxyl group or a thiol group; each of $m^2$, $m^3$, and $m^6$ is an integer of 0 to 9; each of $m^4$ and $m^7$ is an integer of 0 to 8; $m^5$ is an integer of 1 to 9; n is an integer of 0 to 4; and each of $p^2$ to $p^7$ is an integer of 0 to 2;
a cross-linkable compound (C) which is one or more compounds selected from among a melamine compound, a guanamine compound, a glycoluryl compound, a urea compound, an epoxy compound, a thioepoxy compound, an isocyanate compound and an azide compound; and a cross-linking catalyst (D) which is one or more compounds selected from among p-toluenesulfonic acid, trifluoromethanesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-napthalenesulfonic acid, pyridinium trifluoromethanesulfonate, pyridinium p-phenolsulfonate, citric acid, benzoic acid, hydroxybenzoic acid, napthalenecarboxylic acid, 2,4,4,6-tetrabromocyclohexadienone, benozin tosylate, 2-nitrobenzyl tosylate, trifluoromethanesulfonic acid partially or totally blocked with a quaternary element, hexafluoroantimonic acid partially or totally blocked with a quaternary element, dodecylbenzenesulfonic acid partially or totally blocked with an amine, an aromatic sulfonium hexafluorophosphate, and an aromatic sulfonium hexafluoroantimonate.

4. A resist underlayer film wherein a baked product of a coating film formed of a resist underlayer film forming composition as recited in claim 1.

5. A resist underlayer film characterized by being a baked product of a coating film formed of a resist underlayer film forming composition as recited in claim 3.

6. A resist pattern formation method wherein comprising
a step of applying on a semiconductor substrate a resist underlayer film forming composition as recited in claim 1;
a step of baking the composition to thereby form a resist underlayer film; and
using the film in semiconductor production.

7. A resist pattern formation method characterized by comprising
a step of applying on a semiconductor substrate a resist underlayer film forming composition as recited in claim 3;
a step of baking the composition to thereby form a resist underlayer film; and
using the film in semiconductor production.

8. A semiconductor device production method comprising:
a step of forming, on a semiconductor substrate, a resist underlayer film from a resist underlayer film forming composition as recited in claim 1;
a step of forming a resist film on the resist underlayer film;
a step of forming a resist pattern through exposure to light or electron beam and development;
a step of etching the resist underlayer film by the mediation of the formed resist pattern; and
a step of processing the semiconductor substrate through the patterned resist underlayer film.

9. A semiconductor device production method characterized by comprising:
a step of forming, on a semiconductor substrate, a resist underlayer film from a resist underlayer film forming composition as recited in claim 3;

a step of forming a resist film on the resist underlayer film;
a step of forming a resist pattern through exposure to light or electron beam and development;
a step of etching the resist underlayer film by the mediation of the formed resist pattern; and
a step of processing the semiconductor substrate through the patterned resist underlayer film.

10. A semiconductor device production method comprising:
a step of forming a resist underlayer film from a resist underlayer film forming composition as recited in claim 1;
a step of forming a hard mask on the resist underlayer film;
a step of forming a resist film on the hard mask;
a step of forming a resist pattern through exposure to light or electron beam and development;
a step of etching the hard mask by the mediation of the formed resist pattern;
a step of etching the resist under layer film by the mediation of the patterned hard mask; and
a step of processing the semiconductor substrate through the patterned resist underlayer film.

11. The semiconductor device production method according to claim 10, wherein the hard mask is formed through application or vapor deposition of an inorganic substance.

12. A semiconductor device production method characterized by comprising:
a step of forming a resist underlayer film from a resist underlayer film forming composition as recited in claim 3;
a step of forming a hard mask on the resist underlayer film;
a step of forming a resist film on the hard mask;
a step of forming a resist pattern through exposure to light or electron beam and development;
a step of etching the hard mask by the mediation of the formed resist pattern;
a step of etching the resist under layer film by the mediation of the patterned hard mask; and
a step of processing the semiconductor substrate through the patterned resist underlayer film.

13. The semiconductor device production method according to claim 12, wherein the hard mask is formed through application or vapor deposition of an inorganic substance.

14. A resist underlayer film forming composition comprising a compound (A) represented by formula (1):

wherein, independently, $R^1$ represents a C1 to C30 alkylene group which may have a linear hydrocarbyl group, a branched hydrocarbyl group or a C6 to C30 aromatic group; each of $R^2$ to $R^7$ represents a C1 to C10 linear, branched, or cyclic alkyl group, a C6 to C10 aryl group, a C2 to C10 alkenyl group, a thiol group, or a hydroxyl group; at least one $R^5$ is a hydroxyl group or a thiol group; each of $m^2$, $m^3$, and $m^6$ is an integer of 0 to 9; each of $m^4$ and $m^7$ is an integer of 0 to 8; $m^5$ is an integer of 1 to 9; n is an integer of 0 to 4; and each of $p^2$ to $p^7$ is an integer of 0 to 2, and a cross-linkable compound (B') represented by formula (2'-1) or (2'-2):

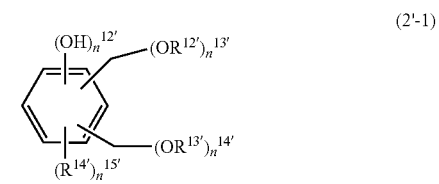

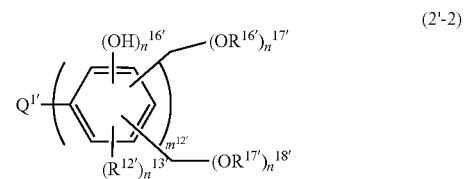

wherein Q1' represents a single bond or an $m^{12'}$-valent organic group; each of $R^{12'}$, $R^{13'}$, $R^{15'}$, and $R^{16'}$ represents a hydrogen atom or a methyl group; each of $R^{14'}$ and $R^{17'}$ represents a C1 to C10 alkyl group or a C6 to C40 aryl group; $n^{12'}$ is an integer of 1 to 3; $n^{13'}$ is an integer of 2 to 5; $n^{14'}$ is an integer of 0 to 3; $n^{15'}$ is an integer of 0 to 3, with these ns having a relationship of $3 \leq (n^{12'}+n^{13'}+n^{14'}+n^{15'}) \leq 6$; n 16' is an integer of 1 to 3; $n^{17'}$ is an integer of 1 to 4; $n^{18'}$ is an integer of 0 to 3; $n^{19'}$ is an integer of 0 to 3, with these ns having a relationship of $2 \leq (n^{16'}+n^{17'}+n^{18'}+n^{19'}) \leq 5$; and $m^{12}$ is an integer of 2 to 10.

15. The resist underlayer film forming composition according to claim 14, which further comprises a cross-linking catalyst (D).

16. The resist underlayer film forming composition according to claim 14, which further comprises a cross-linking catalyst (D) which is one or more compounds selected from among p-toluenesulfonic acid, trifluoromethanesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-napthalenesulfonic acid, pyridinium trifluoromethanesulfonate, pyridinium p-phenolsulfonate, citric acid, benzoic acid, hydroxybenzoic acid, napthalenecarboxylic acid, 2,4,4,6-tetrabromocyclohexadienone, benozin tosylate, 2-nitrobenzyltosylate, trifluoromethanesulfonic acid partially or totally blocked with a quaternary element,

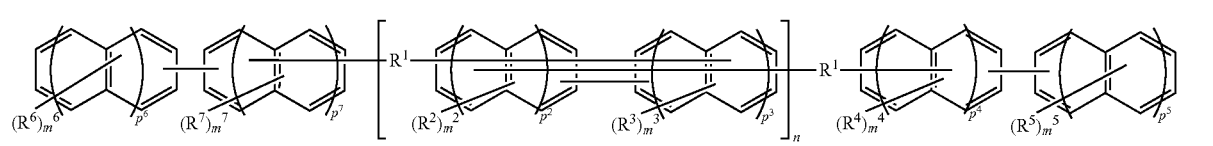

hexafluoroantimonic acid partially or totally blocked with a quaternary element, dodecylbenzenesulfonic acid partially or totally blocked with an amine, an aromatic sulfonium hexafluorophosphate, and an aromatic sulfonium hexafluoroantimonate.

* * * * *